(12) United States Patent
Lochtefeld et al.

(10) Patent No.: US 7,494,881 B2
(45) Date of Patent: Feb. 24, 2009

(54) METHODS FOR SELECTIVE PLACEMENT OF DISLOCATION ARRAYS

(75) Inventors: Anthony J. Lochtefeld, Ipswich, MA (US); Christopher Leitz, Manchester, NH (US); Matthew T. Currie, Boston, MA (US); Mayank T. Bulsara, Cambridge, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 11/945,130

(22) Filed: Nov. 26, 2007

(65) Prior Publication Data

US 2008/0070397 A1 Mar. 20, 2008

Related U.S. Application Data

(62) Division of application No. 10/629,498, filed on Jul. 29, 2003, now abandoned.

(60) Provisional application No. 60/399,171, filed on Jul. 29, 2002, provisional application No. 60/452,516, filed on Mar. 6, 2003.

(51) Int. Cl.
*H01L 21/336* (2006.01)
(52) U.S. Cl. ................... 438/285; 438/938; 438/301
(58) Field of Classification Search ................. 438/197, 438/285, 301, 305, 938; 257/E21.093
See application file for complete search history.

(56) References Cited

U.S. PATENT DOCUMENTS

| | | | |
|---|---|---|---|
| 4,885,614 A | 12/1989 | Furukawa et al. |
| 5,032,893 A | 7/1991 | Fitzgerald, Jr. et al. |
| 5,084,411 A | 1/1992 | Laderman et al. |
| 5,091,767 A | 2/1992 | Bean et al. |
| 5,156,995 A | 10/1992 | Fitzgerald, Jr. et al. |
| 5,256,550 A | 10/1993 | Laderman et al. |
| 5,323,031 A | 6/1994 | Shoji et al. |
| 5,357,119 A | 10/1994 | Wang et al. |
| 5,659,187 A | 8/1997 | Legoues et al. |
| 5,668,387 A | 9/1997 | Streit et al. |
| 5,801,085 A | 9/1998 | Kim et al. |
| 5,810,924 A | 9/1998 | Legoues et al. |
| 5,828,114 A | 10/1998 | Kim et al. |
| 5,844,260 A | 12/1998 | Ohori |
| 5,937,274 A | 8/1999 | Kondow et al. |
| 6,037,615 A | 3/2000 | Matsuyama et al. |
| 6,555,880 B2 | 4/2003 | Cabral, Jr. et al. |
| 6,576,532 B1 | 6/2003 | Jones et al. |

(Continued)

FOREIGN PATENT DOCUMENTS

EP 0402209 12/1990

(Continued)

OTHER PUBLICATIONS

Nabarro, Theory of Crystal Dislocations (1967) pp. 33.

(Continued)

*Primary Examiner*—Bradley K Smith
(74) *Attorney, Agent, or Firm*—Goodwin Procter LLP

(57) ABSTRACT

Misfit dislocations are selectively placed in layers formed over substrates. Thicknesses of layers may be used to define distances between misfit dislocations and surfaces of layers formed over substrates, as well as placement of misfit dislocations and dislocation arrays with respect to devices subsequently formed on the layers.

24 Claims, 12 Drawing Sheets

U.S. PATENT DOCUMENTS

| | | | |
|---|---|---|---|
| 7,049,627 B2* | 5/2006 | Vineis et al. | 257/18 |
| 2002/0185686 A1 | 12/2002 | Christiansen et al. | |
| 2003/0089901 A1* | 5/2003 | Fitzgerald | 257/19 |
| 2003/0227057 A1 | 12/2003 | Lochtefeld et al. | |
| 2004/0005740 A1 | 1/2004 | Lochtefeld et al. | |
| 2004/0031979 A1 | 2/2004 | Lochtefeld et al. | |

FOREIGN PATENT DOCUMENTS

| | | |
|---|---|---|
| EP | 0523487 | 1/1993 |
| EP | 1197992 | 4/2002 |

OTHER PUBLICATIONS

Houghton, "Strain relaxation kinetics in $Si_{1-x}Ge_x$ heterostructures," *J. Appl. Phys.*, vol. 70, No. 4 (Aug. 15, 1991) pp. 2136-2151.

Bruel et al., "® Smart Cut": A Promising New SOI Material Technology, *178 Proceedings 1995 IEE International SOI Conference* (Oct. 1995) pp. 178-179.

Akatsu et al., Wafer bonding of different III-V compound semiconductors by atomicv hydrogen surface cleaning,: *Journal of Applied Physics*, vol. 90, No. 8 (Oct. 15, 2001), pp. 3856-3862.

Belgal et al., "A New Mechanism of Pipeline Defect Formation in CMOS Devices," *International Reliability Physics Symposium*, (1994), pp. 399-404.

Bulsara et al., "Relaxed InxGa1-xAs graded buffers grown with organometallic vapor phase epitaxy on GaAs," *Applied Physics Letters*, vol. 72, No. 13 (Mar. 30, 1998), pp. 1608-1610.

Culliset al., "Growth ripples upon strained SiGe epitaxial layers on Si and misfit dislocation interactions," Journal of Vacuum Science and Technology, A 12(4) (Jul./Aug. 1994), pp. 1924-1931.

Currie et al., "CVarrier mobilities and process stability of strained Si n- and p-MOSFETs on SiGe virtual substrates," *Journal of Vacuum Science and Technology*, B 19(6) (Nov./Dec. 2001), pp. 2268-2279.

De Boeck et al., "Growth and structural characterization of embedded InAsSb on GaAs-coated patterned silicon by molecular beam epitaxy," *Applied Physics Letters*, 58 (9) (Mar. 4, 1991), pp. 928-930.

Feenstra et al., "Scattering from strain variations in high-mobility Si/SiGe heterostructures," *Journal of Applied Physics*, 78 (10) (Nov. 15, 1995), pp. 6091-6097.

Fitzgerald et al., "Dislocation dynamics in relaxed graded composition semiconductors," *Materials Science and Engineering*, B67 (1999), pp. 53-61.

Godbey et al., "A Si0.7Ge0.3 strained-layer etch stop for the generation of thin layer undoped silicon," *Applied Physics Letters*, 56 (4) (Jan. 22, 1990), pp. 373-375.

Gonzales et al., "Advantages of thin interfaces in step-graded buffer structures," *Materials Science and Engineering*, B44 (1997), pp. 41-45.

Gray et al., "Effect of Anisotropic Strain on the Crosshatch Electrical Activity in Relaxed GeSi Films," *Physical Review Letters*, vol. 86, No. 16 (Apr. 16, 2001), pp. 3598-3601.

Ha et al., "Anomalous Jundtion Leakage Current Induced by STI Dislocations and Its Impact on Dynamic Random Access Memory Devices," *IEEE Transactions on Electron Devices*, vol. 46, No. 5 (May 1999), pp. 940-946.

Knall et al., "The use of graded InGaAs layers and patterned substrates to remove threading dislocations from GaAs on Si," *Journal of Applied Physics*, 76 (5) (Sep. 1, 1994), pp. 2697-2702.

MacElwee et al., "High-Performance Fully Depleted Silicon-on-Insulator Transistors," *IEEE Transactions on Electron Devices*, vol. 37, No. 6 (Jun. 1990), pp. 1444-1451.

McCarthy et al., "Effect of threading dislocations on AlGaN/ heterojunction bipolar transistors," *Applied Physics Letters*, vol. 78, No. 15 (Apr. 9, 2001), pp. 2235-2237.

Meshkinpour et al., "Role of misfit dislocations on pseudomorphic high electron mobility transistor," *Applied Physics Letters*, 66 (6) (Feb. 6, 1995), pp. 748-750.

Mica et al., "Crystal defects and junction properties in the evolution of device fabrication technology," *Journal of Physics: Condensed Matter*, 14 (2002), pp. 13403-13410.

Momose et al., "Dislocation-free and lattice-matched Si/GaP1-xNx/ Si structure for photo-electronic integrated systems," *Applied Physics Letters*, vol. 79, No. 25 (Dec. 17, 2001), pp. 4151-4153.

Mooney et al., "Scanning x-ray microtopographs of misfit dislocations at SiGe/Si interfaces," *Applied Physics Letters*, vol. 79, No. 15 (Oct. 8, 2001), pp. 2363-2365.

Mooney et al., "SiGe Technology: Heteroepitaxy and High-Speed Microelectronics," *Annual Review of Materials Science*, 30 (2000), pp. 335-362.

Mooney et al., "Thermal Stability of Strained Si on Relaxed Si1-xGex Buffer Layers," *Materials Research Society Symposium Proceedings*, vol. 686 (2002), pp. A1.2.1-A1.2.6.

Morris et al., "Structure property anisotropy in lattice-mismatched single heterostructures," *Journal of Applied Physics*, 71 (5) (Mar. 1, 1992), pp. 2321-2327.

Ohashi et al., "Simulation of dislocation accumulation in ULSI cells with STI structure," *Applied Surface Science*, (2003), pp. 1-7.

Rammohan et al., "Study of μm-scale spatial variations in strain of a compositionally step-graded InxGa1-x/GaAs(001) heterostructure," *Applied Physics Letters*, 66 (7) (Feb. 13, 1995), pp. 869-871.

Samavedam et al., "Novel dislocation structure and furface morphology effects in relaxed Ge/Si-Ge(graded)/Si structures," *Journal of Applied Physics*, 81 (7) (Apr. 1, 1997), pp. 3108-3116.

Sleight et al., "Stress induced Defects and Transistor Leakage for Shallow Trench Isolated SOI," *IEEE Transactions on Electron Devices*, vol. 20, No. 5 (May 1999), pp. 248-250.

Soh et al., "Relation Between Etch Pit Pairs And Pipeline Defects In CMOS Device," *International Reliability Physics Symposium*, pp. 244-248.

Su et al., "Effects of Dislocation and Bulk Micro Devects on Device Leakage," Semicon Taiwan 2001, pp. 1-4.

Thompson et al., "NMOS Device Characteristics in Electron-Beam-Recrystallied SOI," *IEEE Transactions on Electron Devices*, vol. 40, No. 7 (Jul. 1993), pp. 1270-1276.

Tromp et al., "Advanced in Situ Ultra-High Vacuum Electron Microscopy: Growth of SiGe on Si," *Annual Review of Materials Science*, 30 (2000), pp. 431-449.

Wang et al., "Pipeline Defects in CMOS MOSFET Devices Caused by Swami Isolation," *International Reliability Physics Symposium*, (1992), pp. 85-90.

Williams et al., Evaluation of the Yield Impact of Epitaxial Devects on Advanced Semicondfuctor Technologies, 2000 IEEE/SEMI Advanced Semiconductor Manufacturing Conference, pp. 1-7.

Wu, "Novel Etch-Stop Materials for Silicon Micromachining," Master of Science Thesis, Massachusetts Institute of Technology, 1997.

Yamada et al., "Static analysis of off-axis crystal film growth onto a lattice-mismatched substrate," *Applied Physics Letters*, vol. 79, No. 5 (Jul. 30, 2001), pp. 608-610.

International Search Report for International Application No. PCT/US03/23804, Mar. 15, 2004.

* cited by examiner

METHODS FOR SELECTIVE PLACEMENT OF DISLOCATION ARRAYS

This application is a divisional application of U.S. Utility application Ser. No. 10/629,498, filed Jul. 29, 2003 now abandoned, which claims the benefit of U.S. Provisional Application Ser. No. 60/399,171, filed on Jul. 29, 2002, and U.S. Provisional Application Ser. No. 60/452,516, filed on Mar. 6, 2003. The entire disclosures of these three applications are hereby incorporated by reference.

FIELD OF THE INVENTION

This invention relates generally to semiconductor substrates and particularly to semiconductor substrates with strained semiconductor layers.

BACKGROUND

Silicon-germanium (SiGe) virtual substrates are a platform for new generations of very large scale integration (VLSI) devices that exhibit enhanced performance in comparison to devices fabricated on bulk Si substrates. An important component of a SiGe virtual substrate is a layer of SiGe that has been relaxed to its equilibrium lattice constant (i.e., one that is larger than that of Si). This relaxed SiGe layer may be formed directly on a Si substrate (e.g., by wafer bonding or direct epitaxy) or atop a relaxed graded SiGe layer, in which the lattice constant of the SiGe material has been increased gradually over the thickness of the layer. The SiGe virtual substrate can also incorporate buried insulating layers, echoing the structure of a semiconductor-on-insulator (SOI) wafer. In order to fabricate high performance devices on these platforms, thin strained semiconductor layers of Si, Ge, or SiGe are grown on the relaxed SiGe virtual substrates. The resulting biaxial tensile or compressive strain alters carrier mobilities in these layers, enabling the fabrication of high speed and/or low power devices.

Differences in lattice constants of various materials may result in misfit dislocations forming at an interface between the thin strained semiconductor layer, such as strained Si and an underlying layer, such as relaxed SiGe.

Misfit dislocations form when an upper strained semiconductor layer reaches a critical thickness $T_{crit}$. This equilibrium critical thickness is a not a function of temperature, but at reduced temperatures, strained layers may be grown in a metastable state. The metastable thickness of the strained layer may be thicker than $T_{crit}$, but misfit dislocations may not have formed because of the absence of sufficient thermal energy for their formation. The metastable critical thickness of a strained layer is larger than $T_{crit}$, and decreases with increasing temperature. At temperatures commonly used for complementary metal-oxide semiconductor (CMOS) processing, the metastable critical thickness of a typical upper strained semiconductor layer is close to $T_{crit}$. The critical thickness of a strained layer utilized in CMOS devices and processed at elevated temperatures may be therefore considered the equilibrium critical thickness $T_{crit}$.

One may avoid the formation of misfit dislocations in, e.g., CMOS devices by keeping the thickness of the upper strained semiconductor layer much less than $T_{crit}$. This approach, however, places severe constraints on CMOS design rules. In addition, the close proximity of an underlying semiconductor layer containing, for example, SiGe to a top surface of the wafer creates a number of process optimization challenges, such as the definition of source and drain junctions, formation of metal silicides, and fabrication of shallow-trench-isolation (STI) regions. Optimization of these design features is complicated by interaction with, e.g., both Si and Ge.

Alternatively, one may distance misfit dislocations from an upper strained semiconductor layer by, e.g., forming the upper strained semiconductor layer with a thickness much greater than a critical thickness for misfit dislocation formation. Then, however, the misfit dislocations—even though concentrated away from the top surface of the strained layer—may cause problems in devices, such as MOSFETs, fabricated in this layer. Because the density of misfit dislocations increases as layer thickness increases above $T_{crit}$, this solution may create a high density of misfit dislocations at an interface between the strained layer and the underlying layer. Misfit dislocations may act as diffusion pipes, facilitating migration of dopants between sources and drains, thereby promoting leakage. Misfit dislocations may also act as carrier recombination/generation centers in which electrons and holes combine, thereby also promoting leakage. Further, non-uniform distribution of misfit dislocations may introduce spatial variations in strain across the surface of the wafer. Moreover, making the upper strained semiconductor layer too thick may result in the relaxation of the layer, thereby negating the increase in carrier mobility provided by a strained layer.

SUMMARY

Misfit dislocations may create problems in devices such as metal-oxide-semiconductor field-effect transistors (MOSFETs). The misfit dislocations may act as recombination centers in which electrons and holes combine. Further, misfit dislocations may create diffusion pipes for dopants, such as boron or arsenic, leading, e.g., to a short between a source and a drain. In both instances, the misfit dislocations may act as leakage paths, leading to poor device performance, characterized, for example, by high off currents ($I_{off}$).

The present invention facilitates selection of the location of misfit dislocations between semiconductor layers, including at least one strained layer, to improve performance of devices fabricated on these layers. The misfit dislocations may be placed at a depth deep enough not to significantly affect device characteristics. The depth of the misfit dislocations is also shallow enough to avoid significantly relaxing the strained layer, thereby maintaining the carrier mobility enhancement provided by the strained layer. In accordance with the invention, a window is identified in which the thickness of the strained layer is thick enough so that the misfit dislocations are substantially removed from a device channel but thin enough to avoid carrier mobility degradation.

In an aspect, the invention features a method for selecting a placement of misfit dislocations, the method including forming a first layer over a substrate, the first layer having a first equilibrium lattice constant. A second layer is formed over the first layer, the second layer having (i) a second equilibrium lattice constant different from the first equilibrium lattice constant, and (ii) a critical thickness at which a plurality of misfit dislocations form at an interface proximate the second layer. A thickness of the second layer is selected to define a distance between a top surface of the second layer and the misfit dislocations that form at the interface corresponding to the selected placement of misfit dislocations when the thickness is equal to or greater than the critical thickness.

One or more of the following features may be included. The first layer may include a relaxed layer and/or a compressively strained layer and/or germanium. The second layer may include a tensilely strained layer and/or a compressively strained layer and/or silicon. The thickness of the second layer may be selected to reduce carrier recombination. A plurality of dopants may be introduced into a portion of the first layer, with the thickness of the second layer selected to reduce lateral diffusion piping of the dopants along the interface between the first layer and second layers.

At least one of a source and a drain region may be defined by introducing a plurality of dopants into a portion of the second layer, with a bottommost portion of the source or drain region being disposed at a preselected distance from the misfit dislocations at the interface. The preselected distance may be selected so that the source or drain is substantially free of misfit dislocations. The bottommost portion of the source or drain region may be disposed above the interface. The thickness of the second layer may be at least 1000 Å. The at least one of the source and drain regions may include an extension, and the misfit dislocations at the interface may be disposed (i) below the extension and (ii) above the bottommost portion of the source or drain region. The thickness of the second layer may be selected from the range comprising approximately 400 angstroms to 500 angstroms. Defining the source or drain region may include the introduction of the plurality of dopants by a single implantation step. The source and the drain regions cooperate to form a transistor.

A semiconductor layer may be formed over a portion of the second layer, so that at least a portion of the semiconductor layer is disposed over the source or drain region. The semiconductor layer may include at least one of a group II, a group III, a group IV, a group V, a group VI element, and combinations thereof. The thickness of the semiconductor layer may be selected so that the bottommost portion of the source or drain region is disposed above the preselected distance from the interface.

A metal layer may be formed over the semiconductor layer, and the substrate may be heated to form a contact layer including metal-semiconductor alloy, with the contact layer including at least a portion of the semiconductor layer and at least a portion of the metal layer. Forming the contact layer may include consuming substantially all of the semiconductor layer. Forming the contact layer may include consuming at least a portion of the second layer and/or only a portion of the semiconductor layer. The semiconductor layer may have a third equilibrium constant, and the third equilibrium constant may be substantially equal to the first equilibrium constant of the first layer.

In another aspect, the invention features a method for forming a semiconductor structure. The method includes the steps of forming a first layer over a substrate, the first layer having a first equilibrium lattice constant, and forming a second layer over the first layer, the second layer having (i) a second equilibrium lattice constant different from the first equilibrium lattice constant, and (ii) a critical thickness at which a plurality of misfit dislocations form at an interface proximate the second layer. A thickness of the second layer is selected to define a distance between a top surface of the second layer and the misfit dislocations that form at the interface such that a device formed over the second layer has an off current less than approximately $10^{-8}$ Amperes/micrometer and a strained channel.

In another aspect, the invention features a method for placing misfit dislocations at a desired location within a semiconductor structure. A first layer is formed over a substrate, the first layer including a first material having a first equilibrium lattice constant. A second layer is formed over the first layer, the second layer including a second material having (i) a second equilibrium lattice constant different from the first equilibrium lattice constant, and (ii) a critical thickness at which a plurality of misfit dislocations form at an interface proximate the second layer. The first material, the second material, and a second layer thickness are selected to place the misfit dislocations at the desired location.

In another aspect, the invention features a semiconductor structure having a selected placement of misfit dislocations. The structure includes a first layer disposed over a substrate, the first layer having a first equilibrium lattice constant; and a second layer disposed over the first layer, the second layer having (i) a second equilibrium lattice constant different from the first equilibrium lattice constant, and (ii) a critical thickness at which a plurality of misfit dislocations form at an interface proximate the second layer. A thickness of the second layer is selected to define a distance between a top surface of the second layer and the misfit dislocations that form at the interface corresponding to the selected placement when the thickness is equal to or greater than the critical thickness.

One or more of the following features may be included. The first layer may include a relaxed layer and/or a compressively strained layer and/or germanium. The second layer may include a tensilely strained layer and/or silicon. The thickness of the second layer may be selected to reduce carrier recombination. A plurality of dopants may be disposed in a portion of the first layer, with the thickness of the second layer selected to reduce diffusion piping of the dopants out of the portion of the first layer.

A transistor may be formed over the second layer, the transistor including (i) a gate dielectric disposed over a portion of the second layer, (ii) a gate disposed over the gate dielectric, the gate comprising a conducting material, and (iii) a source and a drain disposed proximate the gate and extending into the second layer. The misfit dislocations may be disposed at a preselected distance from an interface between the gate dielectric and the second layer. The transistor may have an off current of less than $10^{-8}$ Amperes/micrometer and a strained channel.

At least one of a source and a drain region may be defined in a portion of the second layer and may include a plurality of dopants, with the second layer having a thickness greater than the critical thickness and a bottommost portion of the source or drain region being disposed at a preselected distance from the misfit dislocations at the interface. The first layer may include a relaxed layer and/or a compressively strained layer and/or germanium. The second layer may include a tensilely strained layer and/or a compressively strained layer and/or silicon. The preselected distance may be selected so that the source or drain region is substantially free of misfit dislocations. Substantially all of the bottommost portion of the source or drain region may be substantially equidistant from a topmost portion of the source or drain region disposed in the second layer. At least one source and one drain may be defined in the portion of the second layer, and the source and the drain regions may cooperate to form a transistor.

A contact layer including a metal-semiconductor alloy may be disposed over a portion of the second layer. The contact layer may extend into the portion of the second layer.

A semiconductor layer may be disposed over the portion of the second layer, and a portion of the source or drain region may be disposed in the semiconductor layer. The semiconductor layer may include at least one of a group II, a group III, a group IV, a group V, a group VI element, and combinations thereof. The semiconductor layer may have a third equilibrium lattice constant substantially equal to the first equilibrium lattice constant. A contact layer including a metal-semiconductor alloy may be disposed over the semiconductor layer.

In another aspect, the invention features a semiconductor structure including a first layer disposed over a substrate, the first layer having a first equilibrium lattice constant; and a second layer disposed over the first layer, the second layer having (i) a second equilibrium lattice constant different from the first equilibrium lattice constant, and (ii) a critical thickness at which a plurality of misfit dislocations form at an interface proximate the second layer. A thickness of the second layer is selected to define a distance between a top surface of the second layer and the misfit dislocations that form at the interface such that a device formed over the second layer has an off current less than approximately $10^{-8}$ Amperes/micrometer and a strained channel.

In another aspect, the invention features a method for selecting a placement of misfit dislocations. A first layer portion is formed over a substrate, the first layer having a first equilibrium lattice constant, and a regrowth layer is formed over the first layer portion, the regrowth layer having a regrowth equilibrium lattice constant different from the first equilibrium lattice constant. A plurality of misfit dislocations may form at an interface between the first layer portion and the regrowth layer. A second layer is formed over the regrowth layer. A thickness of the regrowth layer is selected to define a distance between a top surface of the second layer and the misfit dislocations corresponding to the selected placement of the misfit dislocations.

One or more of the following features may be included. The second layer may be strained. A lattice mismatch between the first equilibrium lattice constant and the regrowth layer may be less than about 0.04%, and the thickness of the regrowth layer may be less than about 450 nanometers (nm). The first layer may include a first germanium content, the regrowth layer may include a second germanium content, and the difference between the first germanium content and the second germanium content is less than about 1%.

A lattice mismatch between the first equilibrium lattice constant and the regrowth layer may be less than about 0.08%, and the thickness of the regrowth layer may be less than about 210 nm. The first layer may include a first germanium content, the regrowth layer may include a second germanium content, and the difference between the first germanium content and the second germanium content may be less than about 2%.

A lattice mismatch between the first equilibrium lattice constant and the regrowth layer may be less than about 0.12%, and the thickness of the regrowth layer may be less than about 130 nm. The first layer may include a first germanium content, the regrowth layer may include a second germanium content, and the difference between the first germanium content and the second germanium content may be less than about 3%.

In another aspect, the invention features a method for suppressing the formation of misfit dislocations. A first layer portion is formed over a substrate, the first layer having a first equilibrium lattice constant and a first composition. A regrowth layer is formed over the first layer portion, the regrowth layer having a regrowth equilibrium lattice constant and a regrowth composition. The formation of misfit dislocations at an interface between the first layer portion and the regrowth layer is suppressed by the selection of the first and regrowth equilibrium lattice constants and the first and regrowth compositions.

One or more of the following features may be included. The regrowth equilibrium lattice constant may be substantially identical to the first equilibrium lattice constant. The regrowth composition may be substantially identical to the first layer portion composition. A second layer may be grown over the regrowth layer. The second layer may be strained.

In another aspect, the invention features a semiconductor structure including a first layer portion disposed over a substrate, the first layer having a first equilibrium lattice constant. A regrowth layer is disposed over the first layer portion, the regrowth layer having a regrowth equilibrium lattice constant different from the first equilibrium lattice constant. A second layer is disposed over the regrowth layer. A plurality of misfit dislocations is disposed at an interface between the first layer portion and the regrowth layer, and the regrowth layer has a thickness selected to define a distance between a top surface of the second layer and the misfit dislocations.

The following feature may be included. The second layer may strained.

In another aspect, the invention features a semiconductor structure including a first layer portion disposed over a substrate, the first layer having a first equilibrium lattice constant, and a regrowth layer disposed over the first layer portion, the regrowth layer having a regrowth equilibrium lattice constant substantially identical to the first equilibrium lattice constant. A density of misfit dislocations disposed at an interface between the first layer portion and the regrowth layer is substantially zero per square centimeter.

One or more of the features may be included. A second layer may be disposed over the regrowth layer. The second layer may be strained.

In another aspect, the invention features a method for selecting a placement of a dislocation array. A substrate having a first equilibrium lattice constant is provided. A first layer is formed over the substrate, the first layer having a second equilibrium lattice constant. A thickness of the first layer is selected to define a distance between a top surface of the first layer and an interface between the first layer and the substrate. A dislocation array is disposed at the interface corresponding to the selected placement of the dislocation array.

One or more of the following features may be included. The first layer may be strained. The first equilibrium lattice constant may be substantially identical to the second equilibrium constant, and a composition of the first layer may be substantially identical to a composition of the substrate. In another aspect, the invention features a method for selecting a placement of a dislocation array. A substrate is provided having a first equilibrium lattice constant. A first layer is formed over the substrate, the first layer having a second equilibrium lattice constant. A thickness of the first layer is selected to define a distance between a top surface of the first layer and an interface between the first layer and the substrate. The misfit dislocations form at the interface and the thickness of the first layer is selected such that a device formed over the first layer has an off current less than $10^{-8}$ Amperes/micrometer and a strained channel.

In another aspect, the invention features a semiconductor structure including a substrate having a first equilibrium lattice constant; and a first layer disposed over the substrate, the first layer having a second equilibrium lattice constant. A thickness of the first layer is selected to define a distance between a top surface of the first layer and an interface between the first layer and the substrate, a dislocation array is disposed at the interface, and the thickness of the first layer provides (i) an off current less than $10^{-8}$ Amperes/micrometer and (ii) a strained channel in a device formed over the first layer.

The following feature may be included. A transistor may be formed over the first layer, the transistor including (i) a gate dielectric disposed over a portion of the first layer, (ii) a gate disposed over the gate dielectric, the gate comprising a conducting material, and (iii) a source and a drain disposed proximate the gate and extending into the first layer. The dislocation array may be disposed at a preselected distance from an interface between the gate dielectric and the first layer.

In another aspect, the invention features a semiconductor structure having a selected placement of a dislocation array. The structure includes a substrate having a first equilibrium lattice constant, and a first layer disposed over the substrate, the first layer having a second equilibrium lattice constant. A thickness of the first layer is selected to define a distance between a top surface of the first layer and the dislocation array that forms at the interface corresponding to the selected placement.

The following feature may be included. A transistor may be formed over the first layer, the transistor including (i) a gate dielectric disposed over a portion of the first layer, (ii) a gate disposed over the gate dielectric, the gate comprising a conducting material, and (iii) a source and a drain disposed proximate the gate and extending into the first layer. The dislocation array may be disposed at a preselected distance from an interface between the gate dielectric and the first layer.

DETAILED DESCRIPTION

Figure 1:
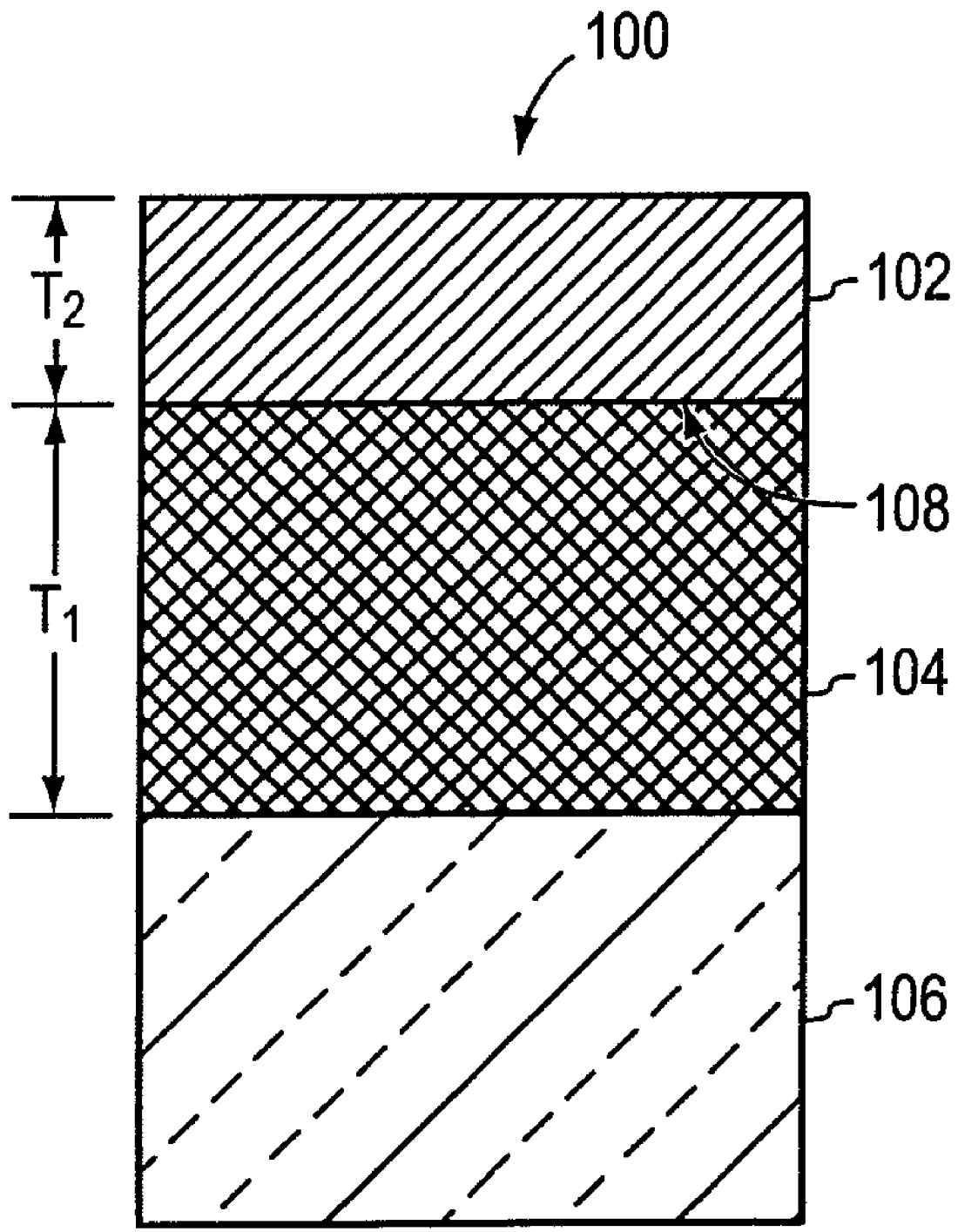
FIGS. 1 and 2 are schematic cross-sectional views of semiconductor substrates with semiconductor layers formed thereon.

Referring to FIG. 1, which illustrates an epitaxial wafer 100 amenable to use with the present invention, a strained layer 102 and a relaxed layer 104 are disposed over a substrate 106. The ensuing discussion focuses on a strained layer 102 that is tensilely strained, but it is understood that strained layer 102 may be tensilely or compressively strained. Strained layer 102 has a lattice constant other than the equilibrium lattice constant of the material from which it is formed, and it may be tensilely or compressively strained; relaxed layer 104 has a lattice constant equal to the equilibrium lattice constant of the material from which it is formed. Tensilely strained layer 102 shares an interface 108 with relaxed layer 104.

Substrate 106 and relaxed layer 104 may be formed from various materials systems, including various combinations of group II, group III, group IV, group V, and group VI elements. For example, each of substrate 106 and relaxed layer 104 may include a III-V compound. Substrate 106 may include gallium arsenide (GaAs), and relaxed layer 104 may include indium gallium arsenide (InGaAs) or aluminum gallium arsenide (AlGaAs). These examples are merely illustrative, and many other material systems are suitable.

In some embodiments, substrate 106 may include an insulator layer and/or a compositionally graded layer (not shown) above and/or below a semiconductor wafer. The graded layer may include Si and Ge with a grading rate of, for example, 10% Ge per micrometer (μm) of thickness, grown at, for example, at 600-1200° C. See, e.g., U.S. Pat. No. 5,221,413. In an embodiment, relaxed layer 104 may include $Si_{1-x}Ge_x$ with a uniform composition, containing, for example, Ge in the range $0.1 \leq x \leq 0.9$ and having a thickness $T_1$ of, e.g., 0.2-2 μm. In an embodiment, $T_1$ is 1.5 μm.

Strained layer 102 may include a semiconductor such as at least one of a group II, a group III, a group IV, a group V, and a group VI element. Strained semiconductor layer 102 may include, for example, Si, Ge, SiGe, GaAs, indium phosphide (InP), and/or zinc selenide (ZnSe). In some embodiments, strained semiconductor layer 102 may include approximately 100% Ge, and may be compressively strained. A strained semiconductor layer 102 comprising 100% Ge may be formed over, e.g., relaxed layer 104 containing uniform $Si_{1-x}Ge_x$ having a Ge content of, for example, 50-90% (i.e., x=0.5-0.9), preferably 70% (i.e., x=0.7).

In an embodiment, tensilely strained layer 102 is formed of silicon. Tensilely strained layer 102 has a thickness $T_2$ of, for example, 50-1000 Å. In an embodiment, thickness $T_2$ is approximately 200 Å.

Relaxed layer 104 and strained layer 102 may be formed by epitaxy, such as by atmospheric-pressure CVD (APCVD), low-(or reduced-) pressure CVD (LPCVD), ultra-high-vacuum CVD (UHVCVD), by molecular beam epitaxy (MBE), or by atomic layer deposition (ALD). Strained layer 102 containing Si may be formed by CVD with precursors such as silane, disilane, or trisilane. Strained layer 102 containing Ge may be formed by CVD with precursors such as germane or digermane. The epitaxial growth system may be a single-wafer or multiple-wafer batch reactor. The growth system may also utilize a low-energy plasma to enhance layer growth kinetics.

In an embodiment in which strained layer 102 contains substantially 100% Si, strained layer 102 may be formed in a dedicated chamber of a deposition tool that is not exposed to Ge source gases, thereby avoiding cross-contamination and improving the quality of interface 108 between strained layer 102 and relaxed layer 104. Furthermore, strained layer 102 may be formed from an isotopically pure silicon precursor(s). Isotopically pure Si has better thermal conductivity than conventional Si. Higher thermal conductivity may help dissipate heat from devices subsequently formed on strained layer 102, thereby maintaining the enhanced carrier mobilities provided by strained layer 102.

In some embodiments, relaxed layer 104 and/or strained layer 102 may be planarized by, e.g., CMP, to improve the quality of subsequent wafer bonding (see discussion below with reference to FIGS. 8-12). Strained layer 102 may have a low surface roughness, e.g., less than 0.5 nm root mean square (RMS).

Figure 2:
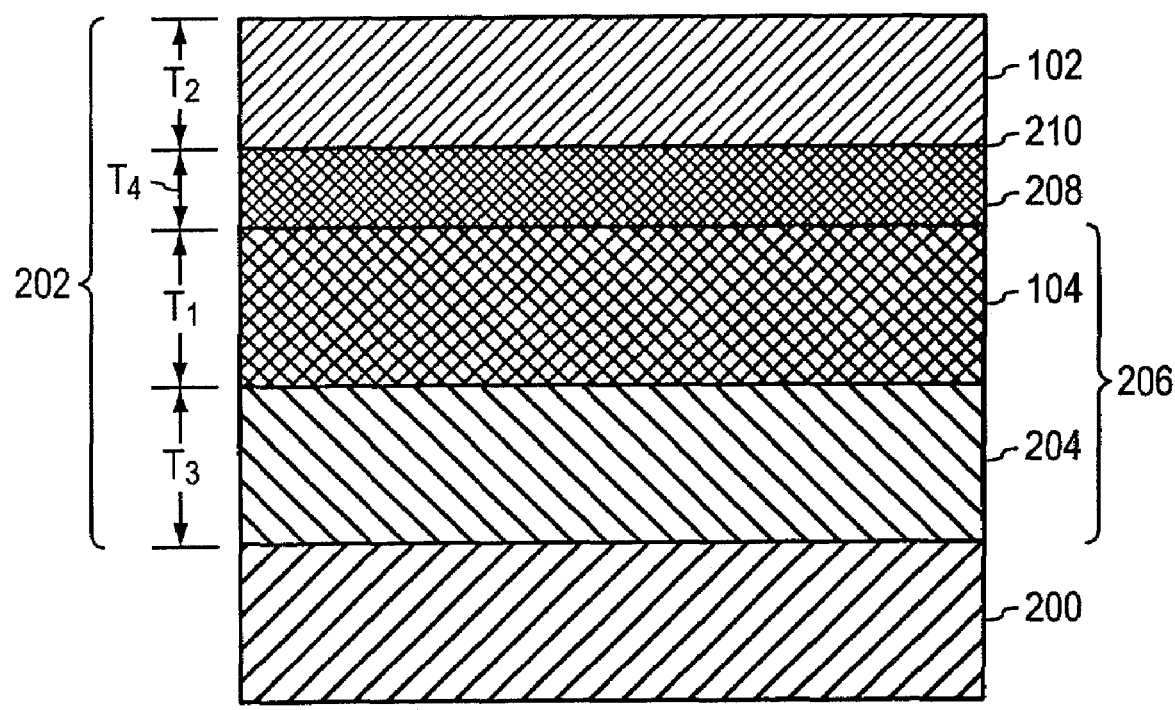

Referring to FIG. 2, in an alternative embodiment, a substrate 200 is a semiconductor, such as silicon. Several layers collectively indicated at 202 are formed on substrate 200. Layers 202 may be grown, for example, by APCVD, LPCVD, or UHVCVD.

Layers 202 include a graded layer 204 disposed over substrate 200. Graded layer 204 may include Si and Ge with a grading rate of, for example, 10% Ge per µm of thickness, and a thickness $T_3$ of, for example, 2-9 µm. Graded layer 204 may be grown, for example, at 600-1200° C. Relaxed layer 104 is disposed over graded layer 204. A virtual substrate 206 includes relaxed layer 104 and graded layer 204.

A compressively strained layer 208 including a semiconductor material is disposed over relaxed layer 104. In an embodiment, compressively strained layer 208 includes group IV elements, such as $Si_{1-y}Ge_y$, with a Ge content (y) higher than the Ge content (x) of relaxed $Si_{1-x}Ge_x$ layer 104. Compressively strained layer 208 contains, for example, Ge in the range $0.25 \leq y \leq 1$ and has a thickness $T_4$ of, e.g., 10-500 angstroms (Å). In some embodiments, compressively strained layer 208 has a thickness $T_4$ of less than 500 Å. In certain embodiments, $T_4$ is less than 200 Å.

Tensilely strained layer 102 is disposed over compressively strained layer 208, sharing an interface 210 with compressively strained layer 208. In an embodiment, tensilely strained layer 102 is formed of silicon. Tensilely strained layer 102 has a thickness $T_2$ of, for example, 50-1000 Å. In an embodiment, thickness $T_2$ is approximately 200 Å. In some embodiments, compressively strained layer 208 may be disposed not under, but over tensilely strained layer 102.

Substrate 200 with layers 202 typically has a threading dislocation density of $10^4$-$10^5$/cm$^2$.

Figure 3A:
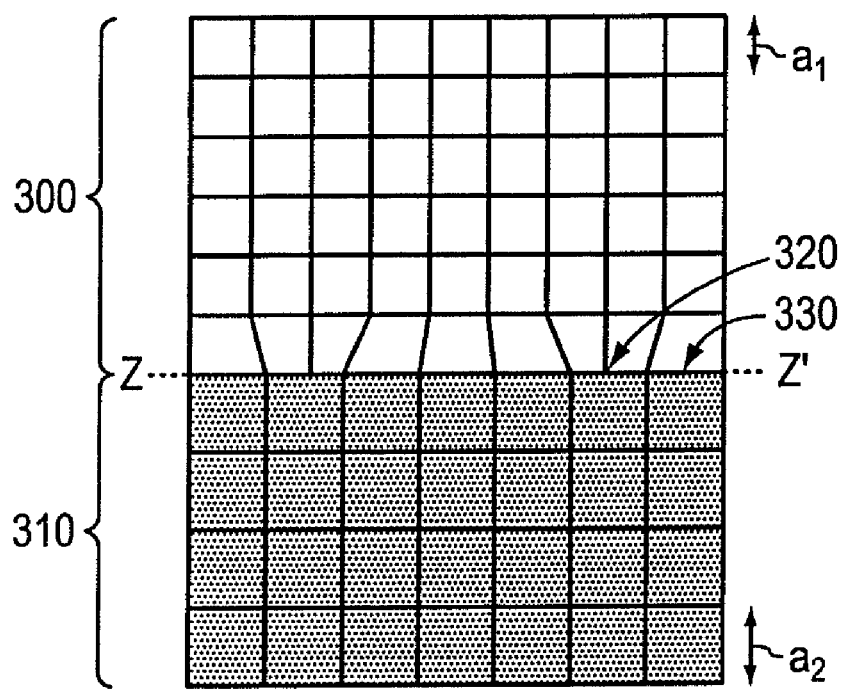
FIGS. 3a-3c are schematic illustrations of misfit and screw dislocations formed between two layers.
Figure 3B:
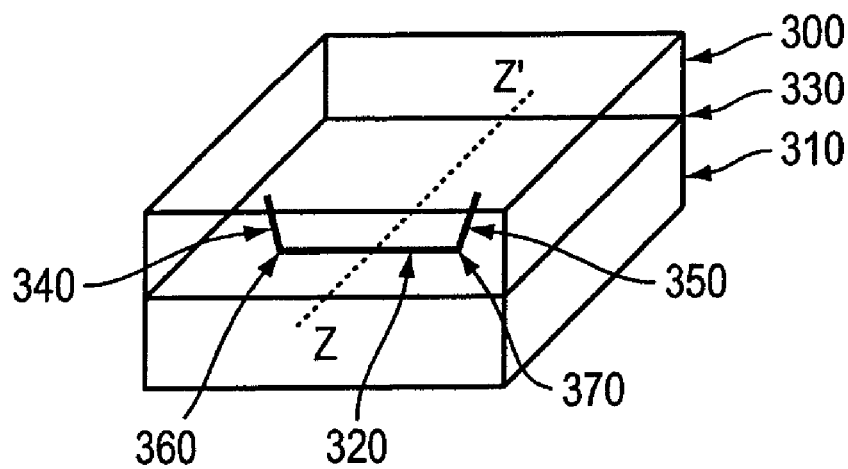

Referring to FIGS. 3a and 3b, misfit dislocations may form under the following conditions. FIG. 3a is a schematic cross-sectional view of a local arrangement of atoms in, e.g., a Si thin film layer 300 on a $Si_{1-x}Ge_x$ layer 310, and FIG. 3b is a three-dimensional view of the layers of FIG. 3a, with atomic arrangements removed for clarity. The line Z-Z' is common to both figures. Si layer 300 has a first equilibrium lattice constant $a_1$, and is disposed over $Si_{1-x}Ge_x$ layer 310 having a second equilibrium lattice constant $a_2$. An equilibrium lattice constant is the lattice constant of an unstrained material. Si has an equilibrium lattice constant $a_1$ of 5.431 Å and Ge has an equilibrium lattice constant of 5.658 Å, so the lattice mismatch between Si and Ge is approximately 4%. In embodiments with Ge content (x) of layer 310 greater than zero, therefore, second equilibrium lattice constant $a_2$ is greater than first equilibrium lattice constant $a_1$. The mismatch between first and second equilibrium lattice constants $a_1$, $a_2$ may result in the formation of a misfit dislocation 320 at an interface 330 between Si layer 300 and $Si_{1-x}Ge_x$ layer 310. Misfit dislocation 320 has an associated first and second threading dislocation 340, 350 at each of its two ends 360, 370. In the illustrated embodiment, first and second threading dislocations 340, 350 each extend through Si layer 300. In alternative embodiments, one or both of threading dislocations 340, 350 may extend through $Si_{1-x}Ge_x$ layer 310.

Analogously, referring to FIGS. 1 and 2, misfit dislocations may form at interface 108 between tensilely strained layer 102 and relaxed layer 104 as well as at interface 210 between tensilely strained layer 102 and compressively strained layer 208. In each case, an equilibrium lattice constant of tensilely strained layer 102 including Si is less than an equilibrium lattice constant of relaxed layer 104 that includes Ge. This difference in equilibrium lattice constants between the two layers may lead to misfit dislocations forming at interface 108 or 210 proximate tensilely strained layer 102.

Misfit dislocations may lead to carrier mobility degradation. In some embodiments, thickness $T_2$ of tensilely strained layer 102 may be as much as approximately three times $T_{crit}$ for misfit dislocation formation, without substantial carrier mobility degradation due to the misfit dislocations. For example, in an embodiment in which tensilely strained layer 102 includes strained silicon and is disposed over relaxed layer 104 including $Si_{1-x}Ge_x$ having a Ge content of, for example, 20% Ge (i.e., x=0.2), $T_{crit}$ may be approximately 150 Å and $T_2$ may be approximately 450 Å without causing significant carrier mobility degradation.

Figure 3C:
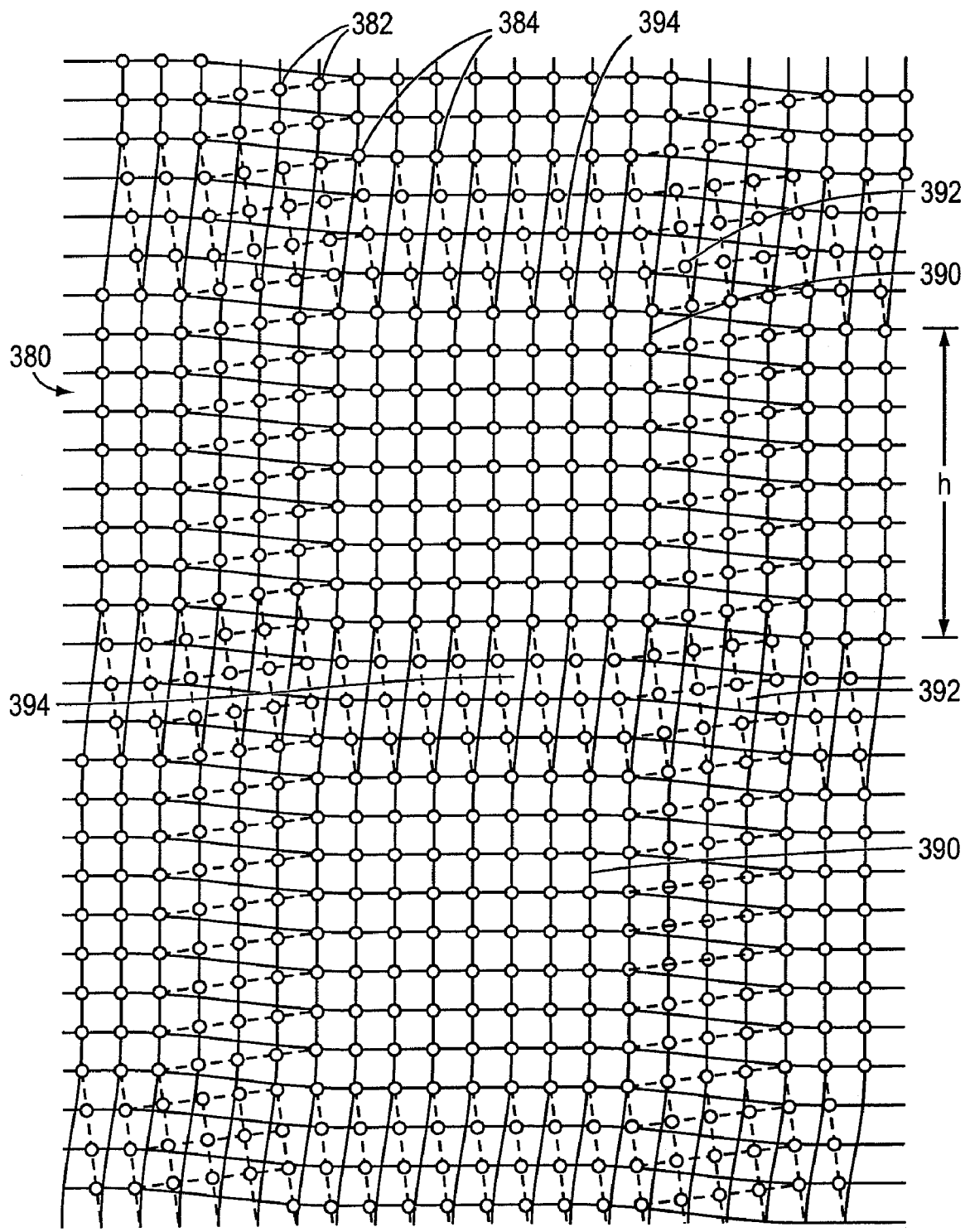

Referring to FIG. 3c, adapted from F. R. N. Nabarro, *Theory of Crystal Dislocations* (1967) p. 33, incorporated by reference herein, an interface 380 between an upper first layer 382 and a bottom second layer 384 formed from crystalline material directly joined by, e.g., wafer bonding, may also contain screw dislocations, a result of in-plane rotation of the first and second layers 382, 384 with respect to each other. FIG. 3c is a schematic top-view representation of atoms in the two layers 382, 384, with the upper layer 382 represented by open circles and the lower layer 384 represented by closed circles. Atoms from the upper layer 382 are bonded directly to atoms from the bottom layer across portions of interface 380, e.g., in a first and a second coherent region 390, as indicated by the perfect overlay of open and closed circles in these regions 390. In coherent regions 390, a lattice of the upper first layer 382 registers, i.e., aligns, with a lattice of the bottom second layer 384. On the other hand, atoms in upper layer 382 may misregister with respect to atoms in bottom layers 384 to form screw dislocations 392. Screw dislocations 392 are separated by a distance h, with the screw dislocations 392 forming a boundary 394 normal to interface 380 between upper and bottom layers 382, 384.

Figure 4:
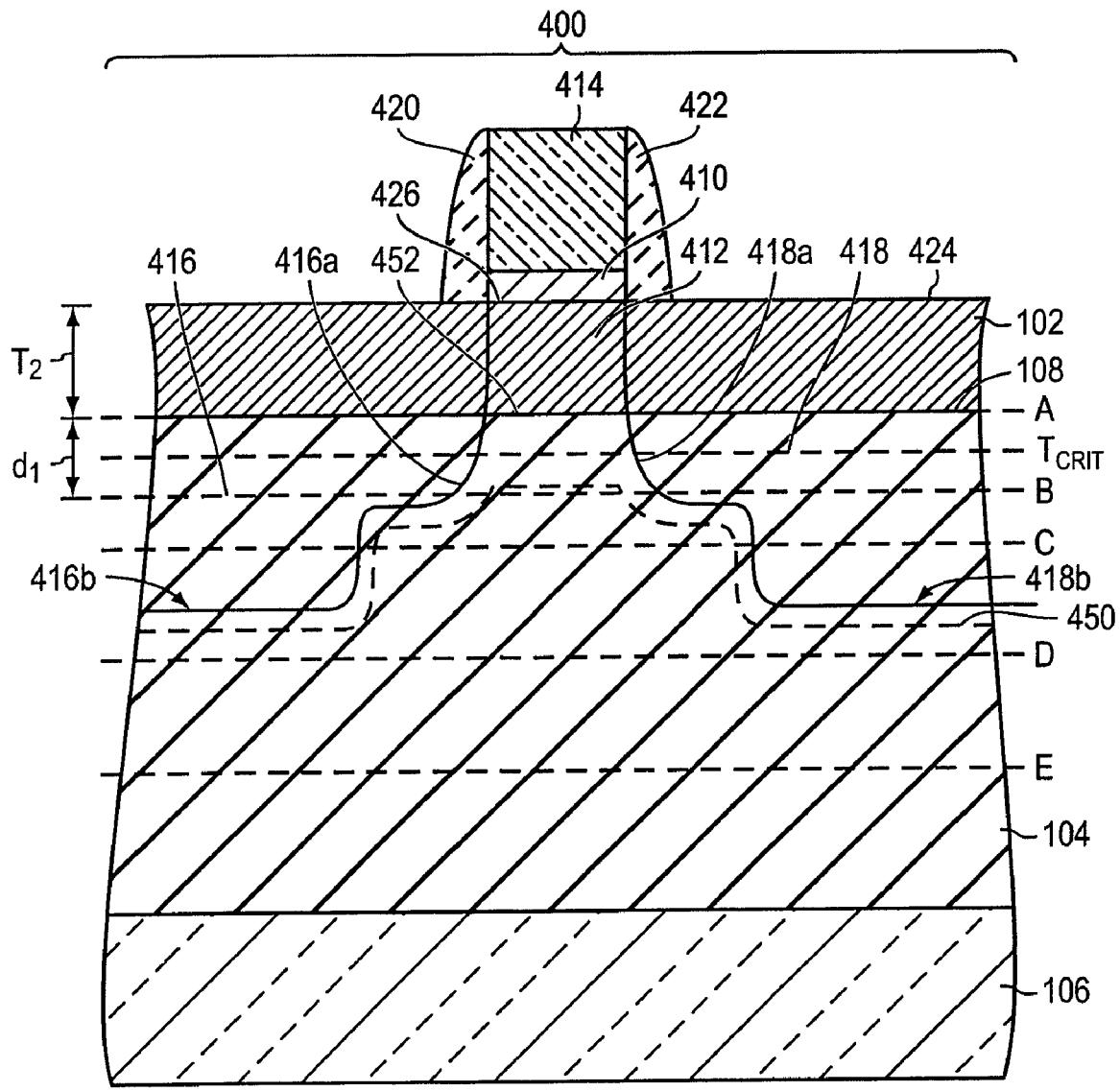
FIG. 4 is a schematic cross-sectional view of a device formed on a semiconductor substrate, the substrate having alternative layer thicknesses.

Referring to FIG. 4, a transistor 400 is formed on substrate 106 with tensilely strained layer 102 disposed over relaxed layer 104. In an embodiment, tensilely strained layer 102 and relaxed layer 104 include Si and $Si_{1-x}Ge_x$, respectively, as described above with reference to FIGS. 1 and 2. Transistor 400 includes a gate dielectric 410 disposed over a portion 412 of tensilely strained layer 102. Gate dielectric 410 may include, for example, thermally grown silicon dioxide. Transistor 400 also includes a gate 414 disposed over gate dielectric 410. Gate 414 includes a conducting material, such as doped polycrystalline silicon. Transistor 400 further includes a source 416 and a drain 418 (defined, for purposes of illustration, by the interior boundaries). In an embodiment, source 416 and drain 418 are formed by the introduction of dopants into tensilely strained layer 102 and relaxed layer 104. Source 416 has a source extension 416a underlying a first sidewall spacer 420, and drain 418 has a drain extension 418a underlying a second sidewall spacer 422. First and second sidewall spacers 420, 422 are positioned proximate gate 414, and may be formed from a dielectric material, such as silicon dioxide, silicon nitride, or a combination of both.

A depletion region 450 is disposed below source 416, drain 418 as well as below gate 410 in a channel 452 of transistor 400. In a typical CMOS device based on 130 nm technology, a depth $d_1$ of the depletion region 450 below gate dielectric 410 is approximately 200 Å. Channel 452 may be strained.

As discussed above, the difference in lattice constants between tensilely strained layer 102 and relaxed layer 104 may lead to the formation of misfit dislocations at interface 108 between tensilely strained layer 102 and relaxed layer 104. By selecting a specific thickness $T_2$ of tensilely strained layer 102, the placement of misfit dislocations at interface 108 may be controlled. A distance between misfit dislocations and a top surface 424 of tensilely strained layer 102 is thereby deliberately defined. In an embodiment in which a transistor, such as transistor 400, is formed on tensilely strained layer 102, this distance is equivalent to a distance between misfit dislocations and an interface 426 between gate dielectric 410 and tensilely strained layer 102.

The positioning of interface 108 and misfit dislocations may be selected by taking into account the following options described below with reference to embodiments A-E illustrated in FIG. 4. In this discussion, thickness $T_2$ denotes a starting thickness of tensilely strained layer 102 as well as final thickness of tensilely strained layer 102 in the theoretical case where the thickness $T_2$ of tensilely strained layer 102 does not change during the fabrication of transistor 400. $T_{crit}$ is assumed to be 175 Å for this example, i.e., misfit dislocations start to form when $T_2 \geqq 175$ Å.

In embodiment A, thickness $T_2$ of tensilely strained layer 102 is less than $T_{crit}$, e.g., $T_2<175$ Å. Here, no misfit dislocations form at interface 108 between tensilely strained layer 102 and relaxed layer 104. The leakage that may be caused by misfit dislocations facilitating diffusion piping or acting as recombination-generation centers is thereby avoided. The low thickness $T_2$ of tensilely strained layer 102, however, may present other device problems due to the close proximity of Ge (included in relaxed layer 104) to the top surface 424 of tensilely strained layer 102. Ge, for example, may present a challenge to the formation of metal silicide with low resistivity over source 416 and drain 418. Further, the placement of bottom boundaries 416b, 418b of source 416 and drain 418, as well as extensions 416a, 418a, in relaxed layer 104 containing Ge is an additional parameter to be considered during device design. Moreover, the extension of shallow trench isolation (STI) (not shown) into regions containing Ge requires modification—or complete revision—of processes conventionally used for forming STI in layers containing only Si.

In embodiment B, thickness $T_2$ of tensilely strained layer 102 extends to line B and therefore is slightly greater than $T_{crit}$. Thickness $T_2$ is, for example, 190 Å. In this embodiment, misfit dislocations at interface 108 between tensilely strained layer 102 and relaxed layer 104, therefore, intersect source extension 416a and drain extension 418a, as well as depletion region 450 in channel 452. Misfit dislocations at interface 108 may lead to diffusion piping, with dopants from source extension 416a and drain extension 418a diffusing along misfit dislocations, possibly creating an electrical short between source extension 416a and drain extension 418a. Diffusion piping is especially likely in embodiment B because of the proximity of source extension 416a and drain extension 418a. A second effect of misfit dislocations in embodiment B is the possibility of the misfit dislocations acting as recombination-generation centers for carriers in the depletion region 450 in channel 452. This recombination-generation, like diffusion piping, is a current sink and may increase $I_{off}$ of transistor 400.

In embodiment C, thickness $T_2$ of tensilely strained layer 102 is greater than $T_{crit}$, and is selected so that misfit dislocations in interface 108 are positioned below source extension 416a and drain extension 418a, but above bottom boundaries 416b, 418b of source 416 and drain 418, respectively. $T_2$ may be, for example, approximately 400-500 Å. Because the distance between source 416 and drain 418 is greater than the distance between source extension 416a and 418a, the risk of diffusion piping occurring along misfit dislocations is reduced. Further, the number of misfit dislocations acting as recombination-generation centers may also be reduced in comparison to embodiment B because of the smaller depletion region 450 area intersected by misfit dislocations in embodiment C. Reduction in recombination-generation helps maintain a low $I_{off}$, e.g., less than $10^{-8}$ Amperes/↑m (A/µm). In some embodiments, $I_{off}$ is less than $10^{-10}$ A/µm. Embodiment C may be, for some applications, the preferred embodiment.

In embodiment D, thickness $T_2$ of tensilely strained layer 102 is even greater than $T_{crit}$, and tensilely strained layer 102 extends below bottom boundaries 416b, 418b of source 416 and drain 418. $T_2$ is, for example, 1000 Å. This embodiment has the advantage of virtually eliminating the risk of diffusion piping because misfit dislocations do not intersect source 416 and drain 418 regions. An additional advantage of embodiment D is that the fabrication of transistor 400 entirely in tensilely strained layer 102 eliminates the need for reengineering source 416 and drain 418 junction depths and dopant profiles to take into account interaction with, e.g., Ge, in relaxed layer 104. Finally, misfit dislocations at interface 108 are relatively far from surface 424 of tensilely strained layer 102. This distance reduces spatial variation in strain that will occur at surface 424 and will reduce carrier mobility variation between a plurality of MOSFETs formed in tensilely strained layer 102. A possible disadvantage of embodiment D, however, is a greater density of threading dislocations in tensilely strained layer 102, induced by its greater thickness $T_2$ and greater density of misfit dislocations. Embodiment D may be desirable for certain applications.

In embodiment E, thickness $T_2$ of tensilely strained layer 102 is much greater than $T_{crit}$, and tensilely strained layer 102 extends significantly below bottom boundaries 416b, 418b of source 416 and drain 418, as well as below depletion region 450. $T_2$ is, for example, greater than 2000 Å. Although embodiment E maintains the advantages of embodiment D, it also has a disadvantage. The misfit dislocation density is even greater, with a significant relaxation of tensile strain in tensilely strained layer 102 and an accompanying reduction in carrier mobilities. Moreover, the threading dislocation density is even greater in this embodiment.

The density of misfit dislocations at interface 108 depends not only on the thickness $T_2$ of tensilely strained layer 102, but also on the difference in equilibrium lattice constants of materials forming tensilely strained layer 102 and an underlying layer, such as relaxed layer 104. For example, a large difference in equilibrium lattice constants will result in the formation of misfit dislocations at interface 108 at a faster rate as thickness $T_2$ is increased above $T_{crit}$ than in an embodiment with a small difference in equilibrium lattice constants.

Referring also to FIG. 2, transistor 400 may also be formed on substrate 200 with layers 202 including compressively strained layer 208 disposed below tensilely strained layer 102. Similar considerations are taken into account in the determination of optimal misfit dislocation placement as are discussed above with reference to a wafer having tensilely strained layer 102 disposed directly on relaxed layer 104.

Figure 5:
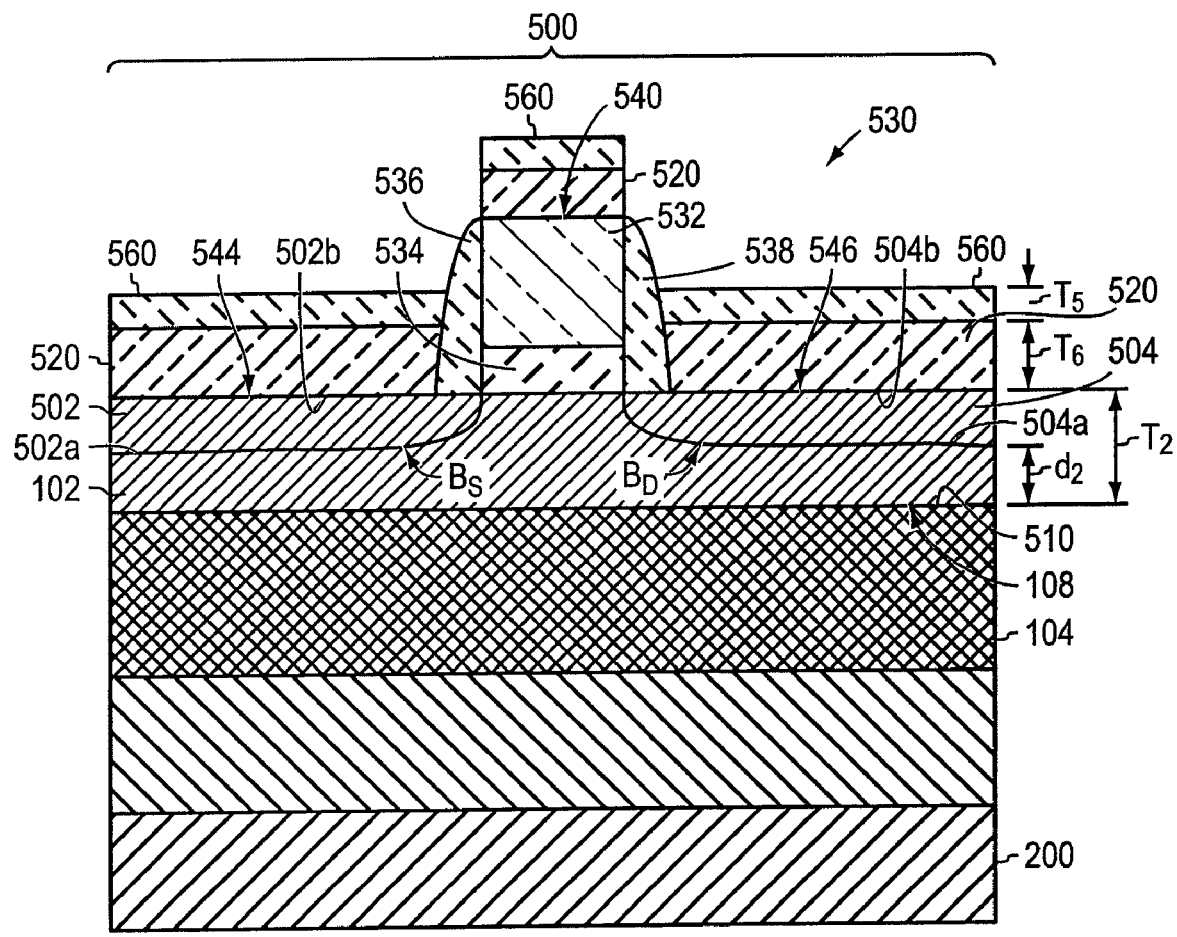
FIG. 5 is a schematic cross-sectional view of a device formed on a semiconductor substrate, the substrate having alternative raised source/drain thicknesses.

Referring to FIG. 5, in an alternative embodiment, the placement of source/drain regions with respect to misfit dislocations may be controlled in part by the formation of raised source and drain regions. For example, a transistor 500 may have a source region 502 and a drain region 504 each having a bottommost portion 502a, 504a that is disposed at a preselected distance $d_2$ from a dislocation array 510. The dislocation array 510 is located at interface 108 between a first layer, such as relaxed layer 104 (or compressively strained layer 208 as shown in FIG. 2), having a first equilibrium lattice constant and a second layer, such as tensilely strained layer 102, having (i) a second equilibrium lattice constant different from the first equilibrium lattice constant, and (ii) a thickness $T_2$ greater than critical thickness $T_{crit}$ at which a plurality of misfit dislocations form at interface 108 proximate the second layer 102. This embodiment is analogous to embodiment D (see FIG. 4). Here, however, the placement of the source and drain 502, 504 above the misfit dislocations 510 in interface 108 is not achieved by forming tensilely strained layer 102 with a thickness $T_2$ that is much greater than $T_{crit}$, and thereby possibly having a greater density of threading dislocations in tensilely strained layer 102. Rather, a semiconductor layer 520 is formed over the second layer, e.g., tensilely strained layer 102, and source and drain regions 502, 504 are effectively disposed both in doped portions of tensilely strained layer 102 and in semiconductor layer 520.

More specifically, source and drain regions 502, 504 may be defined as follows. A gate 530, including a gate electrode 532 and a gate dielectric 534, may be defined over tensilely strained layer 102 by, e.g., photolithography and etching. Gate electrode 532 may include polycrystalline silicon and gate dielectric 534 may include silicon dioxide. Source 502 and drain 504, as indicated by boundaries $B_S$ and $B_D$, are formed proximate gate 530 in tensilely strained layer 102 by, for example, ion implantation. The depths of source 502 and drain 504 in tensilely strained layer 102 are defined so that the bottommost portions 502a, 504a of source 502 and drain regions 502, 504, as bounded by boundaries $B_S$ and $B_D$, are a preselected distance $d_2$ from interface 108. In an embodiment, transistor 500 is an NMOS transistor, and source and drain regions 502, 504 are formed by the implantation of n-type ions, such as arsenic. In an alternative embodiment, transistor 500 is a PMOS transistor, and source and drain regions 502, 504 are formed by the implantation of p-type ions, such as boron.

Isolation regions (not shown) separate transistor 500 from adjacent devices. The isolation regions may be, for example, trenches filled with a dielectric material. A first and a second sidewall spacer 536, 538 are formed proximate gate 530. Sidewall spacers 536, 538 are formed of a dielectric, e.g., silicon dioxide, silicon nitride, or a stack of both or other suitable materials.

Subsequently, semiconductor layer 520 is selectively formed over exposed semiconductor surfaces, such as silicon surfaces, i.e., on top surface 540 of gate electrode 532, a top surface 544 of source 502, and a top surface 546 of drain 504. Semiconductor layer 520 will not form, however, over dielectric surfaces, such as over sidewall spacers 536, 538 and isolation regions (not shown). In an embodiment, semiconductor layer 520 is an epitaxial layer. Semiconductor layer 520 may include a semiconductor material, such as group IV, II-VI, and III-V compounds. In some embodiments, semiconductor layer 520 may include, for example, silicon. The silicon of semiconductor layer 520 may be strained to the same extent that underlying tensilely strained layer 102, also including silicon, is strained. In some embodiments, semiconductor layer 520 may have a third equilibrium lattice constant substantially equal to the first equilibrium lattice constant of the first layer, e.g., relaxed layer 104. Then, layer 520 may be formed with an arbitrary thickness without creating new misfit dislocations at any interface. Semiconductor layer 520 has an initial thickness of, for example, approximately 100-400 Å. Semiconductor layer 520 has a low resistivity of, e.g., 0.001 ohm-cm that facilitates the formation of low-resistance contacts. To achieve this low resistivity, semiconductor layer 520 is, e.g., epitaxial silicon doped with, for example, arsenic to a concentration of $10^{20}$ atoms/cm$^3$. Semiconductor layer 520 may be doped in situ, during deposition. In alternative embodiments, semiconductor layer 520 may be doped after deposition by ion implantation or by gas-, plasma- or solid-source diffusion.

A metal layer is formed over transistor 500. The metal layer may be formed by, for example, sputter deposition. The metal layer may have an initial thickness of, e.g., 50-200 Å and include a metal such as cobalt, titanium, tungsten, nickel, or platinum. The metal is selected to react with semiconductor layer 520 to form a low-resistance metal-semiconductor alloy when exposed to heat, as described below. The metal is also selected such that the metal-semiconductor alloy remains stable at temperatures typically required to complete transistor 500 fabrication, e.g., 400-700° C.

Subsequent to the deposition of the metal layer, a first rapid thermal anneal is performed, e.g., at 550° C. for 60 seconds. This heating step initiates a reaction between the metal layer and semiconductor layer 520, forming a high resistivity phase of a metal-semiconductor alloy, e.g., cobalt silicide (CoSi). Portions of the metal layer are removed by a wet etch, such as sulfuric acid and hydrogen peroxide. In an alternative embodiment, the wet etch may be ammonium hydroxide, peroxide, and water. This wet etch removes the portions of the metal layer disposed over dielectric materials, such as over the first and second sidewall spacers 536, 538 and the isolation regions. Portions of the metal layer disposed over semiconductor layer 520 remain in place after the anneal and wet etch.

Substrate 200, including transistor 500, may be subjected to a second heat treatment. For example, in an embodiment in which the metal layer includes cobalt, substrate 200 undergoes a rapid thermal anneal at 800° C. for 60 seconds in a nitrogen ambient. This heating step initiates a reaction in the metal-semiconductor alloy layer that substantially lowers its resistivity, to form a substantially homogeneous contact layer 560. Contact layer 560 includes a metal-semiconductor alloy, e.g., a metal silicide such as a low resistivity phase of cobalt silicide (CoSi$_2$). Contact layer 560 has a thickness $T_5$ of, for example, 400 Å. Contact layer 560 has a low sheet resistance, e.g., less than about 10 ohm/square, and enables a good quality contact to be made to source and drain regions 502, 504, as well as to gate 530.

During formation, contact layer 560 consumes a portion of semiconductor layer 520. After contact layer 560 formation, semiconductor layer 520 has a thickness $T_6$ of, e.g., 0-200 Å. The remaining portions of semiconductor layer 520 disposed over source and drain regions 502, 504 include the same type of dopants as the source and drain regions 502, 504 and, therefore, effectively function as portions of the source and drain regions 502, 504, respectively. In other words, the source and drain regions 502, 504 may be disposed not only in portions of tensilely strained layer 102 and but also in portions of semiconductor layer 520.

As noted above, the bottommost portions 502a, 504a of the source and drain regions 502, 504, bounded by boundaries Bs and BD respectively, are at preselected distance $d_2$ from the misfit dislocations 510 at interface 108. In an embodiment, formation of conventional deep source/drain implants, which may result in source/drain regions intersecting substrate regions that contain misfit dislocations, may be avoided by the introduction of appropriate dopants into semiconductor layer 520. The presence in semiconductor layer 520 of a second plurality of dopants of the same conductivity type as the dopants present in source and drain regions 502, 504 results in portions of semiconductor layer 520 functioning as portions of source and drain regions 502, 504. In effect, portions of source and drain regions 502, 504 are thereby raised above tensilely strained layer 102. The distance $d_2$ of source and drain regions 502, 504 above misfit dislocations may be selected by tailoring the thicknesses of semiconductor layer 520 and contact layer 560, wherein increasing the thickness of semiconductor layer 520 allows the depth of source and drain regions 502, 504 in tensilely strained layer 102 to be decreased and, in turn, distance $d_2$ of the bottommost portions 502a, 504a of these regions 502, 504 from misfit dislocations to be increased. In summary, distance $d_2$ may be selected such that the source and drain regions 502, 504 are substantially free of dislocations, thereby avoiding diffusion piping between these regions and enhancing transistor 500 performance.

Bottommost portions 502a, 504a of source and drain regions 502, 504, bound by boundaries $B_S$ and $B_D$, may be substantially flat, such that substantially all of the bottommost portions 502a, 504a is substantially equidistant from a topmost portion 502b, 504b of source and drain region 502, 504, respectively, disposed within the second layer, e.g., tensilely strained layer 102. This configuration is achieved by, for example, defining source and drain regions 502, 504 with a single shallow implant, rather than with a conventional process in which both a shallow implant and a deep implant are performed to define source and drain regions.

Figure 6:
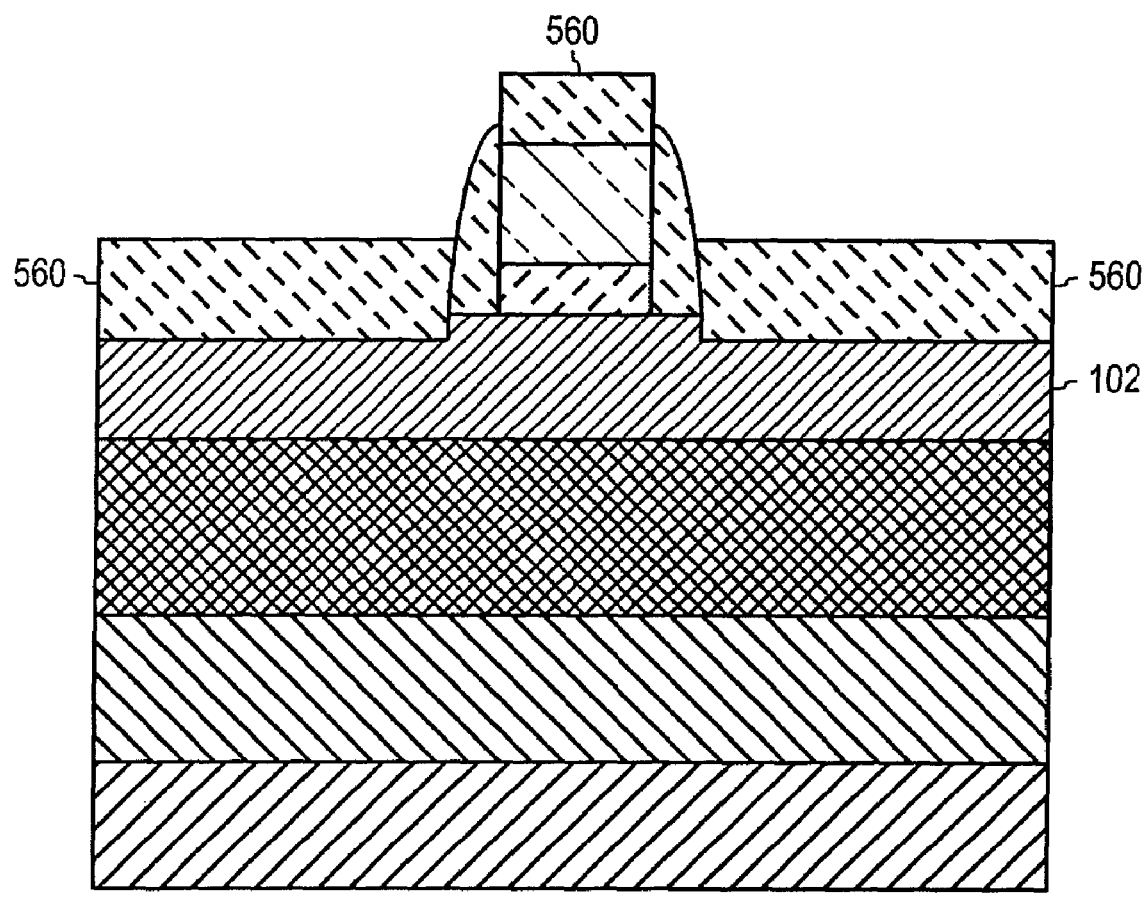
FIG. 6 is a schematic cross-sectional view of a device formed on a semiconductor substrate, the device having an alternative structure.

Referring to FIG. 6 as well as to FIG. 5, in some embodiments, formation of the metal-semiconductor alloy contact layer 560 may include complete consumption of semiconductor layer 520, including consumption of misfit dislocations that may form at interface between semiconductor layer 520 and the second layer, e.g. tensilely strained layer 102, if semiconductor layer 520 is lattice-mismatched with respect to the second layer. In some embodiments, as illustrated, formation of metal-semiconductor alloy may include consuming at least a portion of the second layer, e.g., tensilely strained layer 102, including misfit dislocations that may form at the interface between semiconductor layer 520 and second layer 102, thereby eliminating possible diffusion piping and/or current leakage paths induced by misfit dislocations along this interface.

Figure 7:
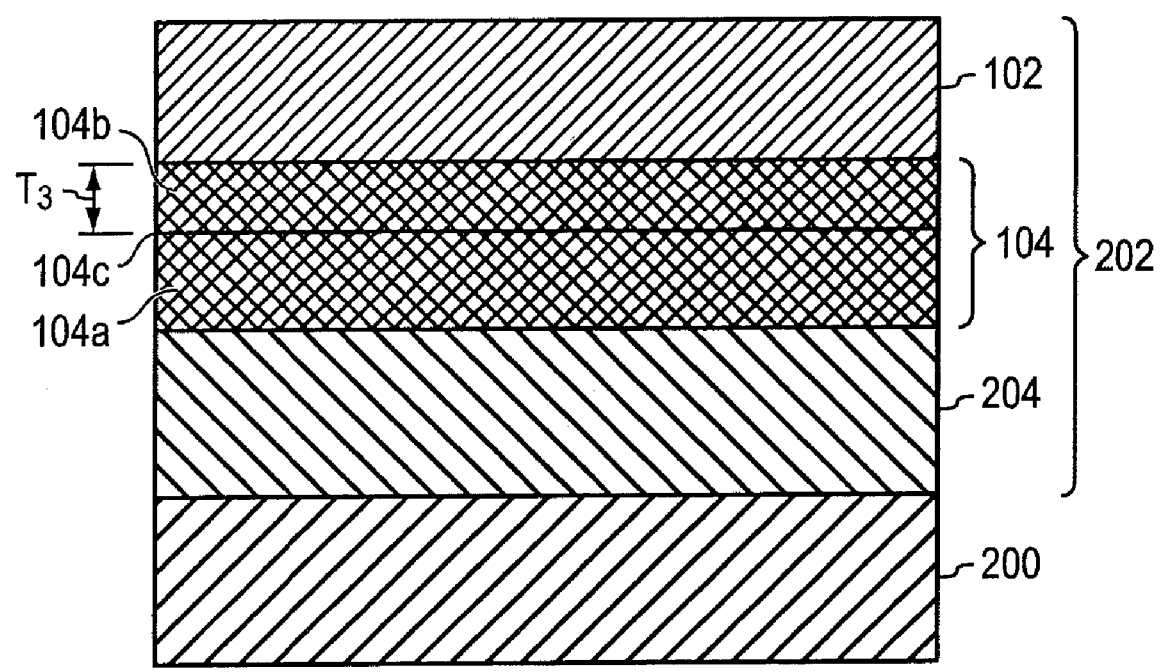
FIG. 7 is a schematic cross-sectional view of a semiconductor substrate with alternative semiconductor layers formed thereon.

Referring to FIG. 7, as described with reference to FIG. 2, layers 202 may be formed over substrate 200. Layers 202 may include graded layer 204, relaxed layer 104, and strained layer 102.

In certain embodiments, relaxed layer 104 may be planarized prior to growth of strained layer 102 to eliminate a crosshatched surface roughness induced by graded buffer layer 204 (see, e.g., U.S. Pat. No. 6,593,641). Alternatively, relaxed layer 104 may be formed by the growth of a first relaxed layer portion 104a, followed by planarization and subsequent growth of a regrowth layer 104b, with an interface 104c formed between the first relaxed layer portion 104a and regrowth layer 104b.

The formation of regrowth layer 104b on planarized first relaxed layer portion 104a may improve the quality of subsequent strained layer 102 growth by ensuring a clean surface for the growth of strained layer 102. Growing on this clean surface may be preferable to growing strained material, e.g., silicon, on a surface that is possibly contaminated by oxygen and carbon from the planarization process. The conditions for epitaxy of the relaxed semiconductor regrowth layer 104b on the planarized first relaxed layer portion 104a may be chosen to minimize the surface roughness of the resulting structure, including of layers formed over regrowth layer 104b.

In some embodiments, misfit dislocations may form at interface 104c, e.g., because of slight differences in Ge content of first layer portion 104a and regrowth layer 104b. These misfit dislocations may adversely affect devices built on layers 202. Two approaches may be taken to reduce the effect of misfit dislocations on devices. First, one may attempt to substantially avoid the formation of misfit dislocations at interface 104c. The formation of misfit dislocations at interface 104c may be lowered to substantially zero dislocations per square centimeter by, e.g., forming regrowth layer 104b with a lattice constant substantially equal to a lattice constant of first relaxed layer portion 104a. This may be achieved by, e.g., forming both first relaxed layer portion 104a and regrowth layer 104b with a substantially same composition at substantially identical processing conditions, with an equilibrium lattice constant of first relaxed layer portion 104a being substantially equal to an equilibrium lattice constant of regrowth layer 104b. For example, first relaxed layer portion 104 may be formed from $Si_{1-x}Ge_x$ with x selected from the range 0 to 1 inclusively, regrowth layer 104b may be formed from $Si_{1-y}Ge_y$ with y selected from the range 0 to 1 inclusively, and x being approximately equal to y. Alternatively, regrowth layer 104b may have a thickness $T_7$ that is less than a critical thickness, i.e., regrowth layer 104b may be strained. The critical thickness $T_{crit}$ of a SiGe layer mismatched by a Ge fraction x can be estimated by the following formula:

$$T_{crit}=(0.55/x)\ln(10T_{crit}),$$

where $T_{crit}$ is given in nanometers. See, e.g., Houghton, *Journal of Applied Physics*, 15 Aug. 1991, 2136-2151, incorporated by reference herein. For example, if first layer portion 104a includes $Si_{0.80}Ge_{0.20}$ and regrowth layer 104b includes $Si_{0.79}Ge_{0.21}$ or $Si_{0.81}Ge_{0.19}$, i.e., a difference in Ge content of about 1% and a lattice mismatch of about 0.04%, the critical thickness $T_{crit}$ of regrowth layer 104b may be greater than 450 nm. Therefore, misfit dislocations at interface 104c may be avoided by keeping thickness $T_7$ of regrowth layer 104b less than 450 nm, so that regrowth layer 104b is strained. In another embodiment, first layer portion 104a may include $Si_{0.80}Ge_{0.20}$ and regrowth layer 104b may include $Si_{0.78}Ge_{0.22}$ or $Si_{0.82}Ge_{0.18}$, i.e., a difference in Ge content of about 2% and a lattice mismatch of about 0.08%. The critical thickness $T_{crit}$ of regrowth layer 104b may be greater than 210 nm. Therefore, misfit dislocations at interface 104c may be avoided by keeping thickness $T_7$ of regrowth layer 104b less than 210 nm, so that regrowth layer 104b is strained. In yet another embodiment, first layer portion 104a may include $Si_{0.80}Ge_{0.20}$ and regrowth layer 104b may include $Si_{0.77}Ge_{0.23}$ or $Si_{0.83}Ge_{0.17}$, i.e., a difference in Ge content of about 3% and a lattice mismatch of about 0.12%. The critical thickness $T_{crit}$ of regrowth layer 104b may be greater than 130 nm. Therefore, misfit dislocations at interface 104c may be avoided by keeping thickness $T_7$ of regrowth layer 104b less than 130 nm, so that regrowth layer 104b is strained. The decision regarding the selection of $T_7$ to ensure that regrowth layer 104b is strained may be based on a historical behavior of a specific reactor in terms of accuracy and repeatability of films with specific Ge content.

In a second approach, the effect of misfit dislocations on devices subsequently built on layers 202 may be reduced by making the thickness $T_7$ of regrowth layer 104b sufficiently thick to allow the devices, such as transistors, to be formed in strained layer 102 and regrowth layer 104b entirely above interface 104c. For example, in the example given above of first relaxed layer portion 104a including $Si_{0.79}Ge_{0.21}$ and regrowth layer 104b including $Si_{0.80}Ge_{0.20}$, regrowth layer 104b may have a thickness $T_7$ that is much greater than the critical thickness of 450 nm, e.g., $T_7$ may be 1.5 μm. Assuming the typical device subsequently formed in strained layer 102 and regrowth layer 104b extends less than 3000 Å-5000 Å into layers 202, the device will be disposed above interface 104c and will be substantially free of misfit dislocations.

Controlling the depth of an interface between two layers to control the placement of dislocations with respect to a device may also be accomplished with strained silicon-on-semiconductor (SSOS) substrates. An SSOS substrate may be formed as follows, as described in U.S. Ser. Nos. 10/456,708, 10/456,103, and 10/264,935, the entire disclosures of each of the three applications being incorporated by reference herein.

Figure 8:
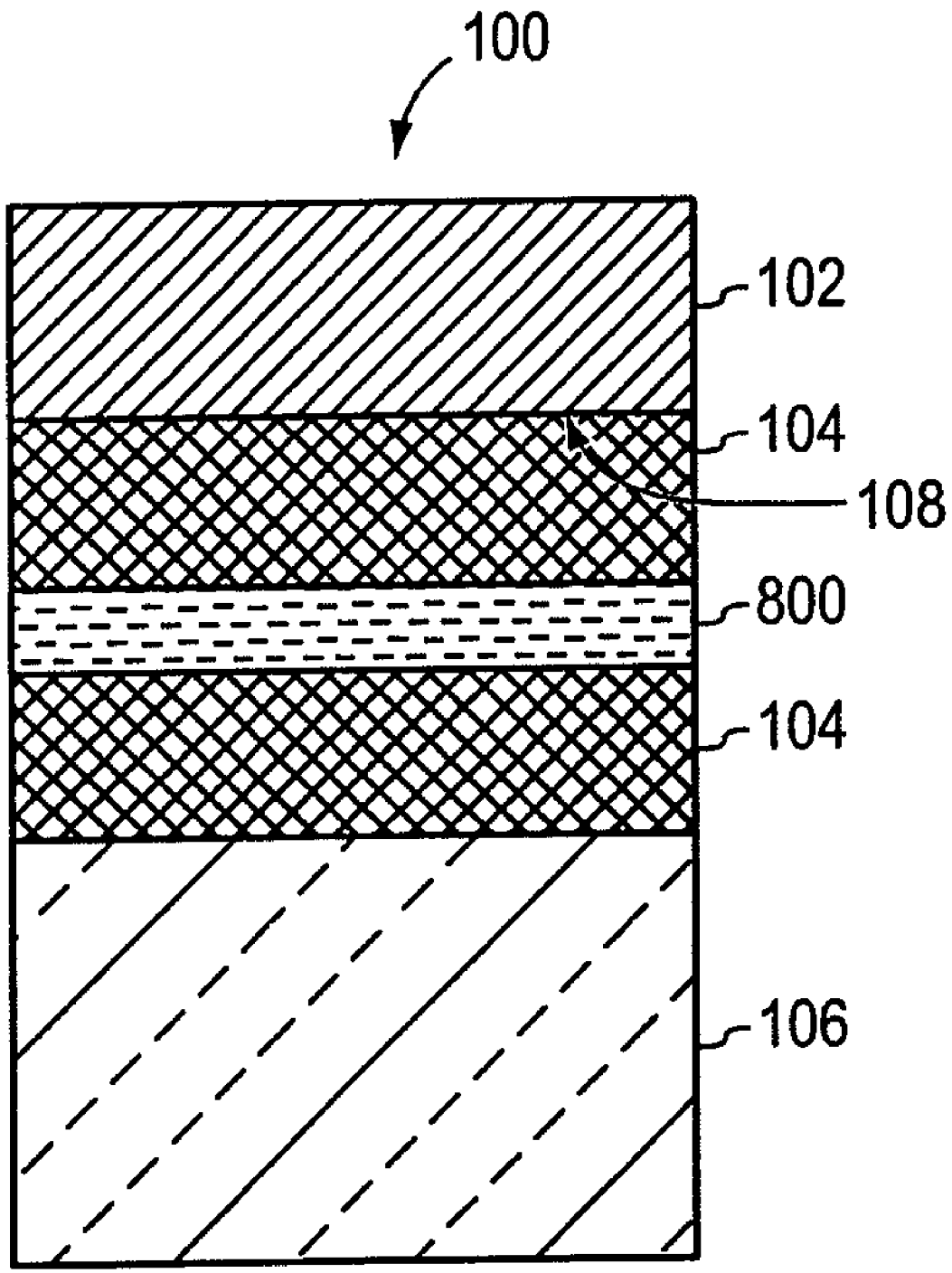
FIGS. 8-12 are schematic cross-sectional views of a semiconductor substrate, illustrating the formation of a strained-semiconductor-on-semiconductor (SSOS) substrate.

Referring to FIG. 8, a cleave plane 800 may be formed in epitaxial wafer 100, such as strained layer 102 and relaxed layer 104 disposed over substrate 106 (see FIG. 1). Strained layer 102 may have been formed at a relatively low temperature, e.g., less than 700° C., to facilitate the definition of abrupt interface 108 between strained layer 102 and relaxed layer 104. This abrupt interface 108 may enhance the subsequent separation of strained layer 102 from relaxed layer 104, as discussed below with reference to FIG. 9. Abrupt interface 108 is characterized by the transition of Si or Ge content (in this example) proceeding in at least 1 decade (order of magnitude in atomic concentration) per nanometer of depth into the sample. In an embodiment, this abruptness may be greater than 2 decades per nanometer.

Cleave plane 800 may be formed, for example, by the implantation of hydrogen ions into relaxed layer 104. This implantation is similar to the SMARTCUT process described by, e.g., Bruel et al., *Proceedings 1995 IEEE International SOI Conference*, October 1995, 178-179, incorporated by reference herein. Implantation parameters may include implantation of hydrogen ($H_2^+$) to a dose of $2.5\text{-}5\times10^{16}$ ions/$cm^2$ at an energy of, e.g., 50-100 keV. For example, $H_2^+$ may be implanted at an energy of 75 keV and a dose of $4\times10^{16}$ ions/$cm^2$ through strained layer 102 into relaxed layer 104. In alternative embodiments, it may be favorable to implant at energies less than 50 keV to decrease the depth of cleave plane 800 and decrease the amount of material subsequently removed during the cleaving process (see discussion below with reference to FIG. 8). In an alternative embodiment, other implanted species, such as $H^+$ or $He^+$, may be used with the dose and energy being adjusted accordingly. The implantation may also be performed prior to the formation of strained layer 102. Then, the subsequent growth of strained layer 102 is preferably performed at a temperature low enough to prevent premature cleaving along cleave plane 800, i.e., prior to the wafer bonding process. This cleaving temperature is a complex function of the implanted species, implanted dose, and implanted material. Typically, premature cleaving may be avoided by maintaining a growth temperature below approximately 500° C.

Figure 9:
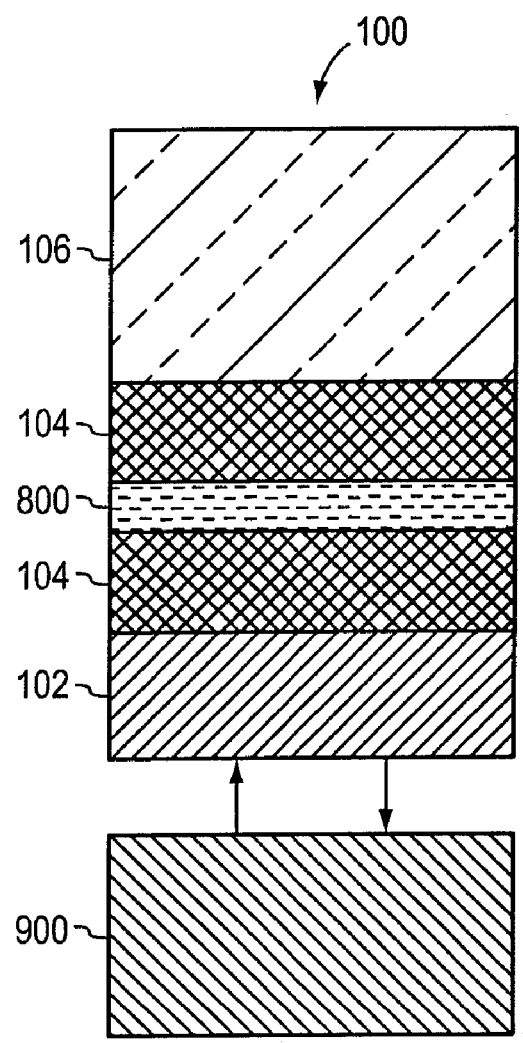

Referring to FIG. 9, epitaxial wafer 100 is bonded to a crystalline handle wafer 900. Handle wafer 900 may include a bulk semiconductor material, such as silicon.

Figure 10:
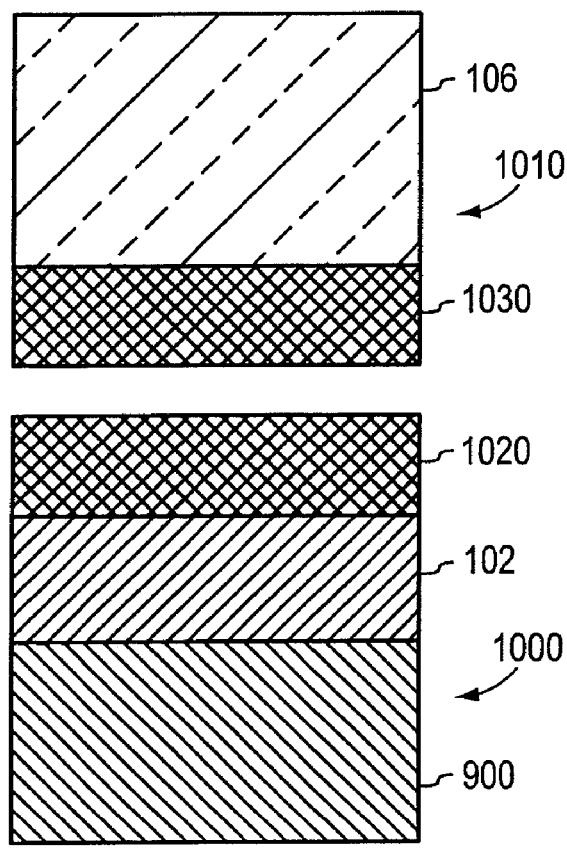

Referring to FIG. 10 as well as to FIG. 9, a split is induced at cleave plane 800 by annealing handle wafer 900 and epitaxial wafer 100 after they are bonded together. This split may be induced by an anneal at 300-700° C., e.g., 550° C., inducing hydrogen exfoliation layer transfer (i.e., along cleave plane 800) and resulting in the formation of two separate wafers 1000, 1010. One of these wafers (1000) has a first portion 1020 of relaxed layer 104 disposed over strained layer 102. Strained layer 102 is in contact with handle wafer 900. The other of these wafers (1010) includes substrate 106, and a remaining portion 1030 of relaxed layer 104. In some embodiments, wafer splitting may be induced by mechanical force in addition to or instead of annealing. If necessary, wafer 1000 with strained layer 102 may be annealed further at 600-900° C., e.g., at a temperature greater than 800° C., to strengthen the bond between the strained layer 102 and handle wafer 900. In some embodiments, this anneal is limited to an upper temperature of about 900° C. to avoid the destruction of a strained Si/relaxed SiGe heterojunction by diffusion.

Figure 11:
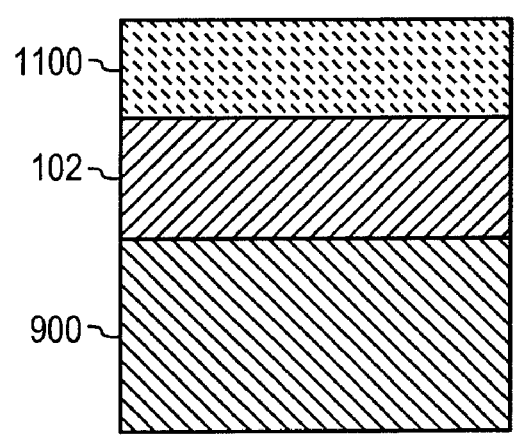

Referring to FIG. 11 as well as to FIG. 10, relaxed layer portion 1020 is removed from strained layer 102. This removal could be accomplished by, for example, wet or dry etching. In an embodiment, removal of relaxed layer portion 1020 containing, e.g., SiGe, includes oxidizing the relaxed layer portion 1020 by wet (steam) oxidation. For example, at temperatures below approximately 800° C., such as temperatures between 600-750° C., wet oxidation will oxidize SiGe much more rapidly then Si, such that the oxidation front will effectively stop when it reaches the strained layer 102, in embodiments in which strained layer 102 includes Si. The difference between wet oxidation rates of SiGe and Si may be even greater at lower temperatures, such as approximately 400° C.-600° C. Good oxidation selectivity is provided by this difference in oxidation rates, i.e., SiGe may be efficiently removed at low temperatures with oxidation stopping when strained layer 102 is reached. This wet oxidation results in the transformation of SiGe to a thermal insulator 1100, e.g., $Si_xGe_yO_z$. The thermal insulator 1100 resulting from this oxidation is removed in a selective wet or dry etch, e.g., wet hydrofluoric acid. In some embodiments, it may be more economical to oxidize and strip several times, instead rather than just once.

In certain embodiments, wet oxidation may not completely remove the relaxed layer portion 1020. Here, a localized rejection of Ge may occur during oxidation, resulting in the presence of a residual Ge-rich SiGe region at the oxidation front, on the order of, for example, several nanometers in lateral extent. A surface clean may be performed to remove this residual Ge. For example, the residual Ge may be removed by a dry oxidation at, e.g., 600° C., after the wet oxidation and strip described above. Another wet clean may be performed in conjunction with—or instead of—the dry oxidation. Examples of possible wet etches for removing residual Ge include a Piranha etch, i.e., a wet etch that is a mixture of sulfuric acid and hydrogen peroxide ($H_2SO_4$: $H_2O_2$) at a ratio of, for example, 3:1. An HF dip may be performed after the Piranha etch. Alternatively, an RCA SC1 clean may be used to remove the residual Ge. The process of Piranha or RCA SC1 etching and HF removal of resulting oxide may be repeated more than once. In an embodiment, relaxed layer portion including, e.g., SiGe, is removed by etching and annealing under a hydrochloric acid (HCl) ambient.

In the case of a strained Si layer 102, the surface Ge concentration of the final strained Si surface is preferably less than about $1\times10^{12}$ atoms/$cm^2$ when measured by a technique such as total reflection x-ray fluorescence (TXRF) or the combination of vapor phase decomposition (VPD) with a spectroscopy technique such as graphite furnace atomic absorption spectroscopy (GFAAS) or inductively-coupled plasma mass spectroscopy (ICP-MS). In some embodiments, after cleaving, a planarization step or a wet oxidation step may be performed to remove a portion of the damaged relaxed layer portion 1020 as well as to increase the smoothness of its surface. A smoother surface may improve the uniformity of subsequent complete removal of a remainder of relaxed layer portion 1020 by, e.g., wet chemical etching. After removal of relaxed layer portion 1020, strained layer 102 may be planarized. Planarization of strained layer 102 may be performed by, e.g., CMP; an anneal at a temperature greater than, for example, 800° C., in a hydrogen ($H_2$) or hydrochloric acid (HCl) containing ambient; or cluster ion beam smoothing.

Figure 12:
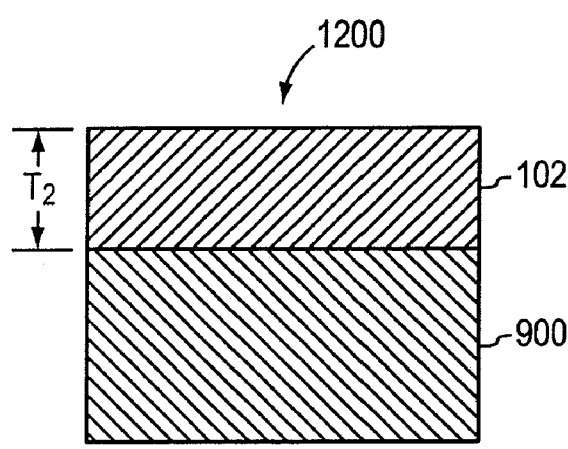

Referring to FIG. 12, after bonding and further processing (as described above), SSOS substrate 1200 is formed, having strained layer 102 disposed in contact with semiconductor handle wafer 900. The strain of strained layer 102 is not induced by underlying handle wafer 900, and is independent of any lattice mismatch between strained layer 102 and handle wafer 900. In an embodiment, strained layer 102 and handle wafer 900 include the same semiconductor material, e.g., silicon. Handle wafer 900 may have a lattice constant equal to a lattice constant of strained layer 102 in the absence of strain. Strained layer 102 may have a strain greater than approximately $10^{-3}$. Strained layer 102 may have been formed by epitaxy, and may have a thickness $T_2$ ranging from approximately 20 Å to approximately 1000 Å, with a thickness uniformity of better than approximately ±10%. In an embodiment, strained layer 102 may have a thickness uniformity of better than approximately ±5%. Strained layer 102 may have a surface roughness of less than 20 Å.

Figure 13:
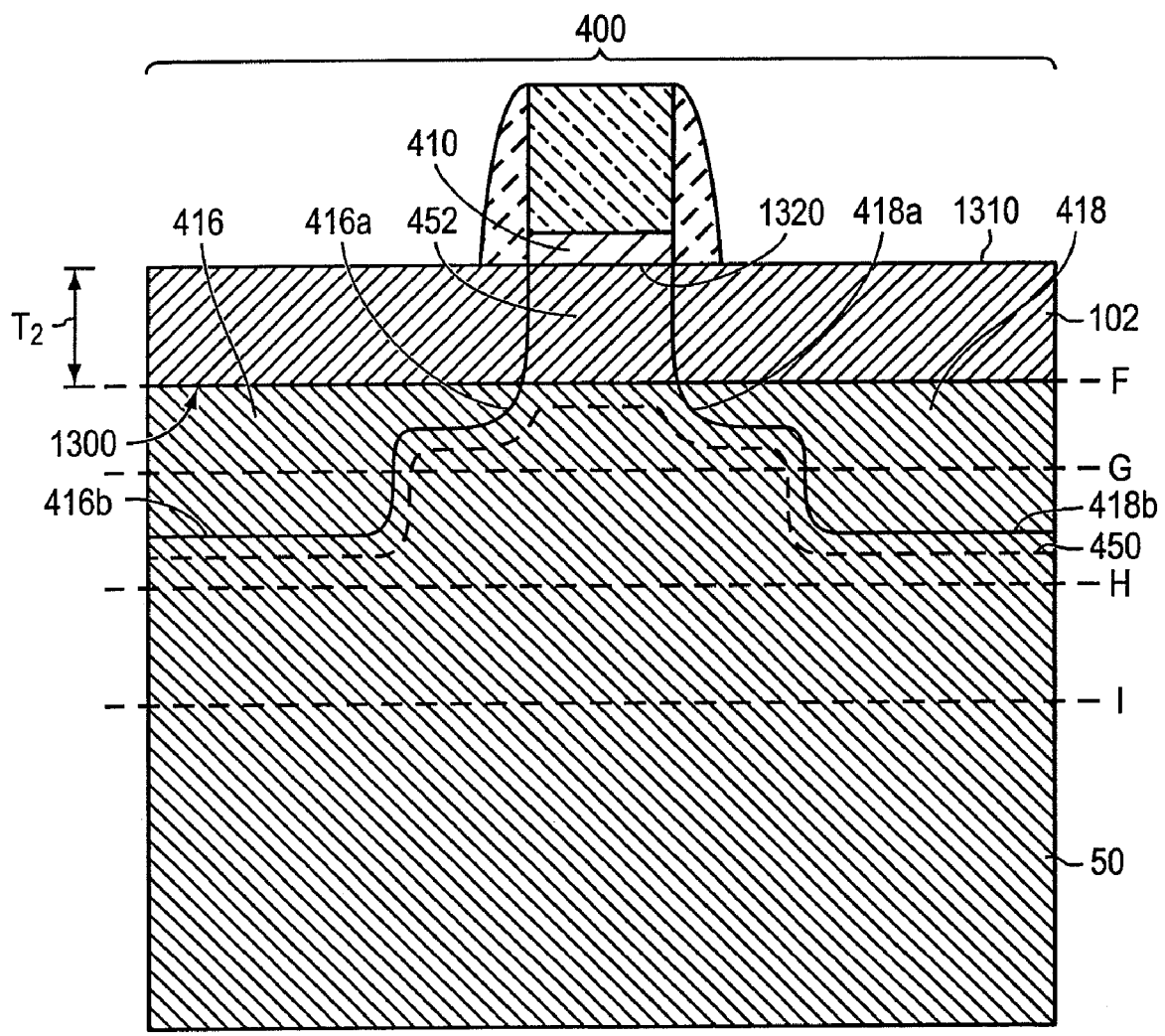
FIG. 13 is a schematic cross-sectional view of a device formed on an SSOS substrate, the substrate having alternative layer thicknesses

Referring to FIG. 13 as well as to FIG. 12, misfit dislocations may form at an interface 1300 between bonded strained layer 102 and handle wafer 900. An additional array of screw dislocations may also arise from local incoherency of the crystalline lattices defined by strained layer 102 and handle wafer 900 across the bonded interface 1300, the result of a slight rotation of strained layer 102 with respect to handle wafer 900 during the bonding process. Together, the misfit dislocations and screw dislocations located at interface 1300 form a dislocation array. By selecting a specific thickness $T_2$ of tensilely strained layer 102, the distance between this dislocation array and a top surface 1310 of tensilely strained layer 102 is thereby deliberately defined. In an embodiment in which a transistor, such as transistor 400, is formed on tensilely strained layer 102, this distance is equivalent to a distance between the dislocation array and an interface 1320 between gate dielectric layer 410 and tensilely strained layer 102. The positioning of interface 1300 and the dislocation array may be selected by taking into account the following options described below with reference to embodiments F-I illustrated in FIG. 13. In this discussion, thickness $T_2$ denotes a starting thickness of tensilely strained layer 102 as well as a final thickness of tensilely strained layer 102 in the theoretical case where the thickness $T_2$ of tensilely strained layer 102 does not change during the fabrication of transistor 400. In embodiment F, thickness $T_2$ of tensilely strained layer 102 extends to line F, so that the dislocation array at interface 1300 between tensilely strained layer 102 and handle wafer 900 intersects source extension 416a and drain extension 418a, as well as depletion region 450 in channel 452. The dislocation array at interface 1300 may lead to diffusion piping, with dopants from source extension 416a and drain extension 418a diffusing along the dislocation array, possibly creating an electrical short between source extension 416a and drain extension 418a. Diffusion piping is especially likely in embodiment F because of the proximity of source extension 416a and drain extension 418a. A second effect of the dislocation array in embodiment F is the possibility of the dislocations acting as recombination-generation centers for carriers in the depletion region 450 in channel 452. This recombination-generation, like diffusion piping, is a current sink and may increase $I_{off}$ of transistor 400.

In embodiment G, thickness $T_2$ of tensilely strained layer 102 is selected so that the dislocation array at interface 1300 are positioned below source extension 416a and drain extension 418a, but above bottom boundaries 416b, 418b of source 416 and drain 418, respectively. $T_2$ may be, for example, approximately 400-500 Å. Because the distance between source 416 and drain 418 is greater than the distance between source extension 416a and 418a, the risk of diffusion piping occurring along dislocations is reduced. Further, the number of dislocations acting as recombination-generation centers may also be reduced in comparison to embodiment F because of the smaller depletion region 450 area intersected by the dislocation array in embodiment G. Reduction in recombination-generation helps maintain a low $I_{off}$, e.g., less than $10^{-8}$ A/μm. In some embodiments, $I_{off}$ is less than $10^{-10}$ A/μm. Embodiment G may be, for some applications, the preferred embodiment.

In embodiment H, thickness $T_2$ of tensilely strained layer 102 is selected so that tensilely strained layer 102 extends below bottom boundaries 416b, 418b of source 416 and drain 418. $T_2$ is, for example, 1000 Å. This embodiment has the advantage of virtually eliminating the risk of diffusion piping because dislocations do not intersect source 416 and drain 418 regions. Finally, misfit dislocations at interface 1300 are relatively far from surface 1310 of tensilely strained layer 102. This distance reduces spatial variation in strain that will occur at surface 1310 and will reduce carrier mobility variation between a plurality of MOSFETs formed in tensilely strained layer 102. A possible disadvantage of embodiment H, however, is a greater density of threading dislocations in tensilely strained layer 102, induced by its greater thickness $T_2$ and greater density of misfit dislocations. Embodiment H may be desirable for certain applications.

In embodiment I, thickness $T_2$ of tensilely strained layer 102 is selected so that tensilely strained layer 102 extends significantly below bottom boundaries 416b, 418b of source 416 and drain 418, as well as below depletion region 450. $T_2$ is, for example, greater than 2000 Å. Although embodiment I maintains the advantages of embodiment H, it also has a disadvantage. The dislocation density is even greater, with a significant relaxation of tensile strain in tensilely strained layer 102 and an accompanying reduction in carrier mobilities. Moreover, the threading dislocation density is even greater in this embodiment.

In some embodiments, handle wafer 900 may have a first equilibrium lattice constant, tensilely strained layer 102 may have a second equilibrium lattice constant that is substantially identical to the first equilibrium lattice constant. Tensilely strained layer 102 may have a composition that is substantially identical to a composition of the substrate.

The invention may be embodied in other specific forms without departing from the spirit of essential characteristics thereof. The foregoing embodiments are therefore to be considered in all respects illustrative rather than limiting on the invention described herein.

What is claimed is:

1. A method for selecting a placement of misfit dislocations, the method comprising the steps of:

forming a first layer over a substrate, the first layer having a first equilibrium lattice constant;

forming a second layer over the first layer, the second layer having (i) a second equilibrium lattice constant different from the first equilibrium lattice constant, and (ii) a critical thickness at which a plurality of misfit dislocations form at an interface proximate the second layer; and defining at least one of a source and a drain region by introducing a plurality of dopants into a portion of the second layer, a bottommost portion of the source or drain region being disposed above the misfit dislocations at the interface, wherein the second layer has a thickness defining a distance between a top surface of the second layer and the misfit dislocations that form at the interface corresponding to the selected placement of misfit dislocations when the thickness is equal to or greater than the critical thickness, such that a device formed at least partially in the second layer is substantially free of misfit dislocations.

2. The method of claim 1, wherein the first layer comprises a relaxed layer.

3. The method of claim 1, wherein the first layer comprises a compressively strained layer.

4. The method of claim 1, wherein the first layer comprises germanium.

5. The method of claim 1, wherein the second layer comprises a tensilely strained layer.

6. The method of claim 1, wherein the second layer comprises a compressively strained layer.

7. The method of claim 1, wherein the second layer comprises silicon.

8. The method of claim 1, wherein the source or drain is substantially free of misfit dislocations.

9. The method of claim 8, wherein the bottommost portion of the source or drain region is disposed above the interface.

10. The method of claim 1, wherein the thickness of the second layer is at least 1000 Å.

11. The method of claim 1, further comprising:
forming a semiconductor layer over a portion of the second layer,
wherein at least a portion of the semiconductor layer is disposed over the source or drain region.

12. The method of claim 11, wherein the semiconductor layer comprises a material selected from the group consisting of a group II, a group III, a group IV, a group V, a group VI element, and combinations thereof.

13. The method of claim 11, wherein a thickness of the semiconductor layer is selected so that the bottommost portion of the source or drain region is disposed above the preselected distance from the interface.

14. The method of claim 11, further comprising:
forming a metal layer over the semiconductor layer; and
heating the substrate to form a contact layer including metal-semiconductor alloy, the contact layer comprising at least a portion of the semiconductor layer and at least a portion of the metal layer.

15. The method of claim 14, wherein forming the contact layer comprises consuming substantially all of the semiconductor layer.

16. The method of claim 14, wherein forming the contact layer comprises consuming at least a portion of the second layer.

17. The method of claim 14, wherein forming the contact layer comprises consuming only a portion of the semiconductor layer.

18. The method of claim 14, wherein the semiconductor layer has a third equilibrium constant, and the third equilibrium constant is substantially equal to the first equilibrium constant of the first layer.

19. The method of claim 11, wherein forming the semiconductor layer comprises deposition.

20. The method of claim 19, wherein forming the semiconductor layer comprises doping the semiconductor layer by introducing dopants after deposition of the semiconductor layer.

21. The method of claim 19, wherein forming the semiconductor layer comprises doping the semiconductor layer by introducing dopants during deposition of the semiconductor layer.

22. The method of claim 1, wherein the device comprises a transistor, and the plurality of misfit dislocations are disposed underneath a source or a drain of the transistor.

23. The method of claim 1, wherein the device comprises a transistor and the plurality of misfit dislocations is disposed beneath a channel of the transistor.

24. A method for placing misfit dislocations at a desired location within a semiconductor structure, the method comprising the steps of:
forming a first layer over a substrate, the first layer comprising a first material having a first equilibrium lattice constant;
forming a second layer over the first layer, the second layer comprising a second material having (i) a second equilibrium lattice constant different from the first equilibrium lattice constant, and (ii) a critical thickness at which a plurality of misfit dislocations form at an interface proximate the second layer; and
defining at least one of a source and a drain region by introducing a plurality of dopants into a portion of the second layer, a bottommost portion of the source or drain region disposed above the misfit dislocations at the interface,
wherein a selected combination of the first material, the second material, and a second layer thickness places the misfit dislocations at the desired location such that a device formed at least partially in the second layer is substantially free of misfit dislocations.

* * * * *